US012581837B2

(12) United States Patent
Choung et al.

(10) Patent No.: US 12,581,837 B2
(45) Date of Patent: Mar. 17, 2026

(54) OLED PIXEL STRUCTURES

(71) Applicant: Applied Materials, Inc., Santa Clara, CA (US)

(72) Inventors: Ji Young Choung, Hwaseong-si (KR); Chung-Chia Chen, Hsinchu City (TW); Sheng-Wen Wang, Tainan City (TW); Yu-Hsin Lin, Zhubei City (TW); Si Kyoung Kim, Gwangju-si (KR); Indrajit Lahiri, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/750,305

(22) Filed: Jun. 21, 2024

(65) Prior Publication Data

US 2025/0324886 A1 Oct. 16, 2025

Related U.S. Application Data

(60) Provisional application No. 63/634,251, filed on Apr. 15, 2024.

(51) Int. Cl.
  *H10K 59/80* (2023.01)
  *H10K 59/12* (2023.01)
  *H10K 59/122* (2023.01)

(52) U.S. Cl.
  CPC ....... *H10K 59/873* (2023.02); *H10K 59/1201* (2023.02); *H10K 59/122* (2023.02)

(58) Field of Classification Search
  None
  See application file for complete search history.

(56) References Cited

U.S. PATENT DOCUMENTS

| | | | | |
|---|---|---|---|---|
| 11,476,313 | B2 | 10/2022 | Choung et al. | |
| 2002/0192595 | A1* | 12/2002 | Otoguro | G03F 7/0758 |
| | | | | 257/E21.235 |
| 2010/0327413 | A1* | 12/2010 | Lee | H01L 21/31144 |
| | | | | 156/345.24 |
| 2022/0077251 | A1 | 3/2022 | Choung et al. | |
| 2022/0077257 | A1* | 3/2022 | Choung | H10K 59/173 |

(Continued)

FOREIGN PATENT DOCUMENTS

CN    111063715 B    7/2022

OTHER PUBLICATIONS

International Search Report and Written Opinion dated May 26, 2025 for Application No. PCT/US2025/014723.

*Primary Examiner* — Nduka E Ojeh
(74) *Attorney, Agent, or Firm* — Patterson + Sheridan, LLP

(57) ABSTRACT

The present disclosure provides devices and methods thereof. An inorganic layer is disposed on a substrate, in which the inorganic layer defines sub-pixels of the device. The inorganic layer includes a plurality of overhang structures. The device includes a plurality of sub-pixels, each sub-pixel including an anode, an organic light-emitting diode (OLED) material disposed over and in contact with the anode, a cathode disposed over and in contact with the OLED material, and an encapsulation layer disposed over the OLED material. A global passivation layer disposed over and in direct contact with a first overhang structure of the plurality of overhang structures, a second overhang structure of the plurality of overhang structures, and the encapsulation layer of each of the sub-pixels.

16 Claims, 19 Drawing Sheets

(56) References Cited

U.S. PATENT DOCUMENTS

| | | | |
|---|---|---|---|
| 2023/0240117 A1 | 7/2023 | Fukuda et al. | |
| 2024/0008316 A1 | 1/2024 | Kawamura et al. | |
| 2024/0040831 A1 | 2/2024 | Chen et al. | |
| 2024/0237493 A1* | 7/2024 | Chang | H10K 59/35 |
| 2024/0284715 A1* | 8/2024 | Bae | H10K 59/88 |
| 2024/0407234 A1* | 12/2024 | Shin | H10K 59/1201 |

* cited by examiner

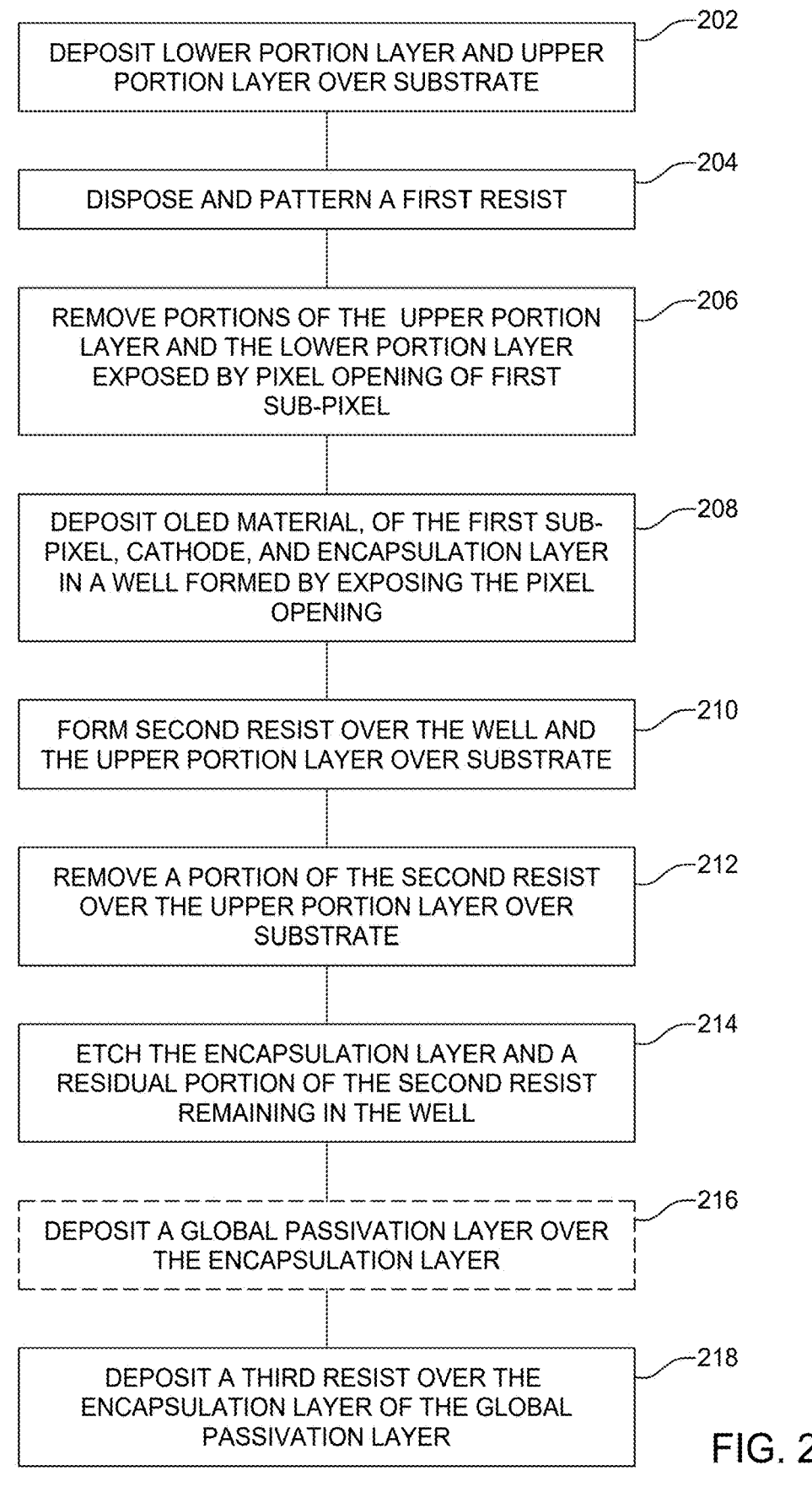

200

DEPOSIT LOWER PORTION LAYER AND UPPER PORTION LAYER OVER SUBSTRATE ⸺202

DISPOSE AND PATTERN A FIRST RESIST ⸺204

REMOVE PORTIONS OF THE UPPER PORTION LAYER AND THE LOWER PORTION LAYER EXPOSED BY PIXEL OPENING OF FIRST SUB-PIXEL ⸺206

DEPOSIT OLED MATERIAL, OF THE FIRST SUB-PIXEL, CATHODE, AND ENCAPSULATION LAYER IN A WELL FORMED BY EXPOSING THE PIXEL OPENING ⸺208

FORM SECOND RESIST OVER THE WELL AND THE UPPER PORTION LAYER OVER SUBSTRATE ⸺210

REMOVE A PORTION OF THE SECOND RESIST OVER THE UPPER PORTION LAYER OVER SUBSTRATE ⸺212

ETCH THE ENCAPSULATION LAYER AND A RESIDUAL PORTION OF THE SECOND RESIST REMAINING IN THE WELL ⸺214

DEPOSIT A GLOBAL PASSIVATION LAYER OVER THE ENCAPSULATION LAYER ⸺216

DEPOSIT A THIRD RESIST OVER THE ENCAPSULATION LAYER OF THE GLOBAL PASSIVATION LAYER ⸺218

FIG. 2

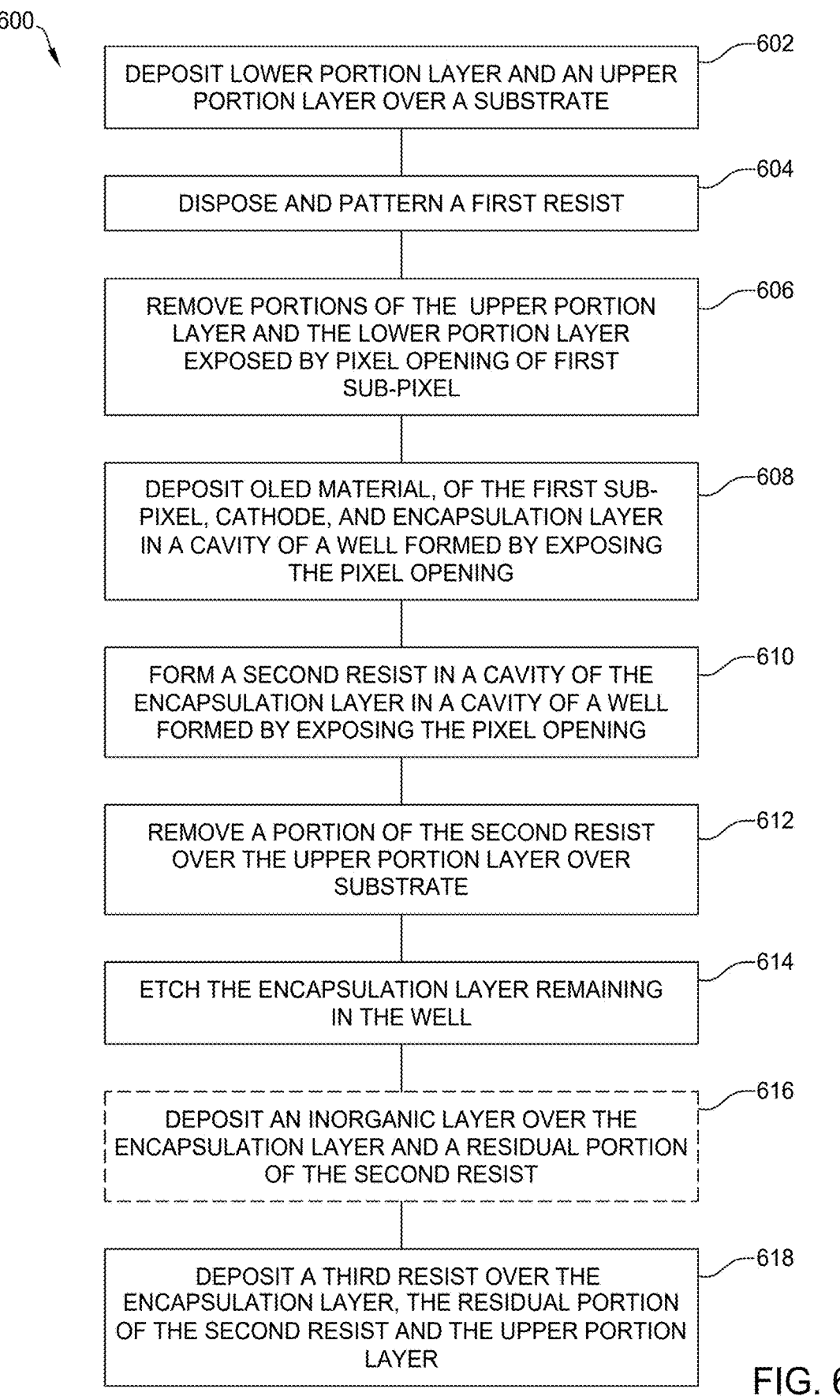

600

DEPOSIT LOWER PORTION LAYER AND AN UPPER PORTION LAYER OVER A SUBSTRATE ⟋602

DISPOSE AND PATTERN A FIRST RESIST ⟋604

REMOVE PORTIONS OF THE UPPER PORTION LAYER AND THE LOWER PORTION LAYER EXPOSED BY PIXEL OPENING OF FIRST SUB-PIXEL ⟋606

DEPOSIT OLED MATERIAL, OF THE FIRST SUB-PIXEL, CATHODE, AND ENCAPSULATION LAYER IN A CAVITY OF A WELL FORMED BY EXPOSING THE PIXEL OPENING ⟋608

FORM A SECOND RESIST IN A CAVITY OF THE ENCAPSULATION LAYER IN A CAVITY OF A WELL FORMED BY EXPOSING THE PIXEL OPENING ⟋610

REMOVE A PORTION OF THE SECOND RESIST OVER THE UPPER PORTION LAYER OVER SUBSTRATE ⟋612

ETCH THE ENCAPSULATION LAYER REMAINING IN THE WELL ⟋614

DEPOSIT AN INORGANIC LAYER OVER THE ENCAPSULATION LAYER AND A RESIDUAL PORTION OF THE SECOND RESIST ⟋616

DEPOSIT A THIRD RESIST OVER THE ENCAPSULATION LAYER, THE RESIDUAL PORTION OF THE SECOND RESIST AND THE UPPER PORTION LAYER ⟋618

FIG. 6

OLED PIXEL STRUCTURES

CROSS-REFERENCE TO RELATED APPLICATION

This application claims priority to U.S. Provisional Patent Application No. 63/634,251, filed on Apr. 15, 2024, the entirety of which is incorporated herein by reference.

BACKGROUND

Field

Embodiments of the present disclosure generally relate to a display. More specifically, embodiments described herein relate to pixels and methods of forming pixels that may be utilized in a display such as an organic light-emitting diode (OLED) display.

Description of the Related Art

Input devices including display devices may be used in a variety of electronic systems. An organic light-emitting diode (OLED) is a light-emitting diode (LED) in which the emissive electroluminescent layer is a film of an organic compound that emits light in response to an electric current. OLED devices are classified as bottom emission devices if light emitted passes through the transparent or semi-transparent bottom electrode and substrate on which the panel was manufactured. Top emission devices are classified based on whether or not the light emitted from the OLED device exits through the lid that is added following the fabrication of the device. OLEDs are used to create display devices in many electronics today. Today's electronics manufacturers are pushing these display devices to shrink in size while providing higher resolution than just a few years ago.

Generally, OLED pixel patterning utilizes a fine metal mask process, which restricts panel size, pixel resolution, and substrate size. Attempts to overcome the challenges of using a fine metal mask process have involved using photolithography processes to pattern pixels. Unfortunately, conventional photolithography processes and OLED pixel patterning processes can result in oxidation of the organic material, oxidation of an overhang of an inorganic material, poor cathode coverage, residue of an encapsulation layer over an inorganic substrate, and poor deposition under an overhang of the inorganic material, each of which can disrupt OLED performance.

Accordingly, what is needed in the art are OLED pixels and methods of forming OLED pixels to improve OLED performance.

SUMMARY

In one embodiment, the present disclosure provides devices. The devices include a substrate. An inorganic layer is disposed on the substrate, in which the inorganic layer defines sub-pixels of the device. The inorganic layer includes a plurality of overhang structures. The device includes a plurality of sub-pixels, each sub-pixel including an anode, an organic light-emitting diode (OLED) material disposed over and in contact with the anode, a cathode disposed over and in contact with the OLED material, and an encapsulation layer disposed over the OLED material. A global passivation layer is disposed over and in direct contact with a first overhang structure of the plurality of overhang structures, a second overhang structure of the plurality of overhang structures, and the encapsulation layer of each of the sub-pixels.

In another embodiment, the present disclosure provides devices. The devices include a substrate. An inorganic layer is disposed on the substrate, in which the inorganic layer defines sub-pixels of the device. The inorganic layer includes a plurality of overhang structures. The device includes a plurality of sub-pixels, each sub-pixel including an anode, an organic light-emitting diode (OLED) material disposed over and in contact with the anode, a cathode disposed over and in contact with the OLED material, an encapsulation layer disposed over the OLED material, and a resist disposed over the encapsulation layer, in which the resist fills the cavity of the encapsulation layer. A global passivation layer is disposed over and in direct contact with a first overhang structure of the plurality of overhang structures, a second overhang structure of the plurality of overhang structures, and the encapsulation layer of each of the sub-pixels.

In another embodiments, the present disclosure provides methods. The methods include disposing a first resist material over a plurality of sub-pixels, the sub-pixels defined by a plurality of inorganic layers exposing an anode of each sub-pixel, the inorganic layers having a plurality of overhang structures disposed thereover. The first resist material is patterned to form a first opening in a first sub-pixel of the plurality of sub-pixels. A first organic light-emitting device (OLED) material is disposed on the anode of the first opening and the plurality of overhang structures. A cathode layer is disposed on the first OLED material and the plurality of overhang structures. An encapsulation layer is disposed over the cathode layer and the plurality of overhang structures. A second resist is formed over the encapsulation layer and the plurality of structures. A portion of the second resist over the plurality of overhang structures is removed. The encapsulation layer, the cathode layer, the first OLED material, and a residual portion of the second resist is etched to expose the plurality of overhang structures. A third resist is deposited over the plurality of overhang structures.

In another embodiment, the present disclosure provides devices. The devices include a substrate. An inorganic layer is disposed on the substrate, in which the inorganic layer defines sub-pixels of the device. The inorganic layer includes a plurality of overhang structures. The device includes a plurality of sub-pixels, each sub-pixel including an anode, an organic light-emitting diode (OLED) material disposed over and in contact with the anode, a cathode disposed over and in contact with the OLED material, and an encapsulation layer disposed over the OLED material. The encapsulation layer includes a lateral portion and a central portion, in which the lateral portion includes an arcuate surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 2 is a flow diagram of a method for forming a sub-pixel circuit, according embodiments described herein.

FIG. 6 is a flow diagram of a method for forming a sub-pixel circuit, according embodiments described herein

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
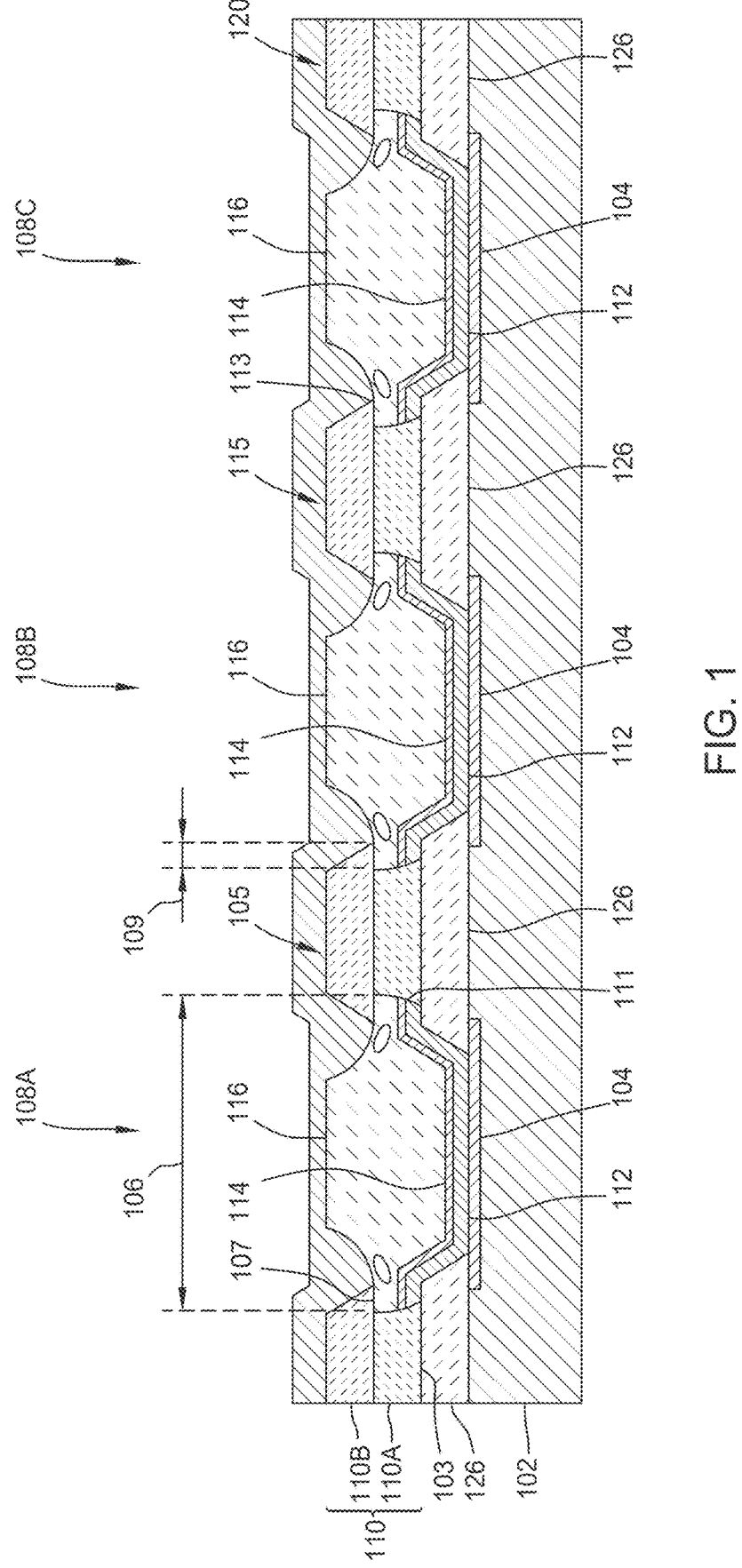
FIG. 1 is a schematic, cross-sectional view of a sub-pixel circuit for an organic light-emitting diode (OLED) display, according to embodiments described herein.

Embodiments of the present disclosure generally relate to a display. More specifically, embodiments described herein relate to pixels and methods of forming pixels that may be utilized in a display, such as an organic light-emitting diode (OLED) display. An inorganic layer is disposed on the substrate, the inorganic layer defining sub-pixels of the device. The inorganic layer including a plurality of overhang structures. Each sub-pixel includes an anode, an organic light-emitting diode (OLED) material disposed over and in contact with the anode, a local passivation layer disposed over the OLED material, a device resist material disposed over and in contact with the local passivation layer. A global passivation layer is disposed over and in direct contact with the plurality of overhang structures and the device resist material of each of the sub-pixels. As used herein, the term "direct contact" refers to directly touching with no deposited layer there between for at least some points of contacts.

Each of the embodiments described herein of the sub-pixel circuit include a plurality of sub-pixels with each of the sub-pixels defined by adjacent inorganic overhang structures that are permanent to the sub-pixel circuit. While the Figures depict three sub-pixels with each sub-pixel defined by adjacent inorganic overhang structures, the sub-pixel circuit of the embodiments described herein can include a plurality of sub-pixels, such as three or more sub-pixels. Each sub-pixel has the OLED material configured to emit a white, red, green, blue or other color light when energized, e.g., the OLED material of a first sub-pixel emits a red light when energized, the OLED material of a second sub-pixel emits a green light when energized, and the OLED material of a third sub-pixel emits a blue light when energized.

The inorganic overhang structures are permanent to the sub-pixel circuit and include at least an upper portion disposed on a lower portion. A first configuration of the inorganic overhang structures includes the upper portion of a non-conductive inorganic material and the lower portion of a conductive inorganic material. A second configuration of the inorganic overhang structures includes the upper portion of a conductive inorganic material and the lower portion of a conductive inorganic material. A third configuration of the inorganic overhang structures includes the upper portion of a non-conductive inorganic material, the lower portion of a non-conductive inorganic material, and an optional assistant cathode disposed under the lower portion. A fourth configuration of the inorganic overhang structures includes the upper portion of a conductive inorganic material, the lower portion of a non-conductive inorganic material, and an optional assistant cathode disposed under the lower portion. Any of the first, second, third, and fourth exemplary embodiments include inorganic overhang structures of at least one of the first, second, third, or fourth configurations.

The adjacent inorganic overhang structures defining each sub-pixel of the sub-pixel circuit of the display provide for formation of the sub-pixel circuit using evaporation deposition and provide for the inorganic overhang structures to remain in place after the sub-pixel circuit is formed. Evaporation deposition may be utilized for deposition of an OLED material (including a hole injection layer (HIL), a hole transport layer (HTL), an emissive layer (EML), and an electron transport layer (ETL)) and cathode. One or more of an encapsulation layer, and a global passivation layer may be disposed via evaporation deposition. The encapsulation layer of a respective sub-pixel is disposed over the cathode with the encapsulation layer extending under at least a portion of each of the adjacent inorganic overhang structures.

FIG. 1 is a schematic, cross-sectional view of a sub-pixel circuit 100. The sub-pixel circuit 100 includes a substrate 102. Metal layers 104 may be patterned on the substrate 102 and are defined by adjacent pixel-defining layer (PDL) structures 126 disposed on the substrate 102. In one embodiment, which can be combined with other embodiments described herein, the metal layers 104 are pre-patterned on the substrate 102, e.g., the substrate 102 is a pre-patterned indium tin oxide (ITO) glass substrate. The metal layers 104 are configured to operate anodes of respective sub-pixels. In one embodiment, the metal layers 104 are a layer stack of a first transparent conductive oxide (TCO) layer, a second metal layer disposed on the first TCO layer, and a third TCO layer disposed on the second metal layer. The metal layers 104 include, but are not limited to, chromium, titanium, gold, silver, copper, aluminum, ITO, a combination thereof, or other suitably conductive materials.

The PDL structures 126 can be disposed on the substrate 102. The PDL structures 126 include one of an organic material, an organic material with an inorganic coating disposed thereover, or an inorganic material. The organic material of the PDL structures 126 includes, but is not limited to, polyimides. The inorganic material of the PDL structures 126 includes, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent PDL structures 126 define a respective sub-pixel and expose the anode (i.e., metal layer 104) of the respective sub-pixel of the sub-pixel circuit 100.

The sub-pixel circuit 100 has a plurality of sub-pixels 106 including at least a first sub-pixel 108A, a second sub-pixel 108B, and a third sub-pixel 108C. While the Figures depict the first sub-pixel 108A, the second sub-pixel 108B, and the third sub-pixel 108C, the sub-pixel circuit 100 of the embodiments described herein may include three or more sub-pixels 106, such as a fourth and a fifth sub-pixel. Each sub-pixel 106 has an OLED material 112 configured to emit a white, red, green, blue or other color light when energized, e.g., the OLED material 112 of the first sub-pixel 108a emits a green light when energized, the OLED material of the second sub-pixel 108*b* emits a red light when energized, the OLED material of the third sub-pixel 108*c* emits a blue light when energized, and the OLED material of a fourth sub-pixel emits a other color light when energized Inorganic overhang structures 110 are disposed on an upper surface 103 of the substrate 102, thereby defining each sub-pixel of the plurality of sub-pixels. In some embodiments, as shown in FIG. 1, the inorganic overhang structures 110 are disposed on an upper surface 103 of each of the PDL structures 126. The inorganic overhang structures 110 are permanent to the sub-pixel circuit. The inorganic overhang structures 110 further define each sub-pixel 106 of the sub-pixel circuit 100. The inorganic overhang structures 110 include at least an upper portion 110B disposed on a lower portion 110A. A first configuration of the inorganic overhang structures 110 includes the upper portion 110B of a non-conductive inorganic material and the lower portion 110A of a conductive inorganic material. A second configuration of the inorganic overhang structures 110 includes the upper portion 110B of a conductive inorganic material and the lower portion 110A of a conductive inorganic material. A third configuration of the inorganic overhang structures 110 includes the upper portion 110B of a non-conductive inorganic material, the lower portion 110A of a non-conductive inorganic material, and an optional assistant cathode (not shown) disposed under the lower portion 110A. A fourth configuration of the inorganic overhang structures 110 includes the upper portion 110B of a conductive inorganic material, the lower portion 110A of a non-conductive inorganic material, and an optional assistant cathode (not shown) disposed under the lower portion 110A. The first, second, third, and fourth exemplary embodiments of the sub-pixel circuit 100 include inorganic overhang structures 110 of at least one of the first, second, third, or fourth configurations. The inorganic overhang structures 110 are able to remain in place, e.g., are permanent.

The non-conductive inorganic material includes, but is not limited to, an inorganic silicon-containing material, e.g., the silicon-containing material includes oxides or nitrides of silicon, or combinations thereof. The conductive inorganic material includes, but is not limited to, a metal-containing material, e.g., the metal-containing material includes copper, titanium, aluminum, molybdenum, silver, indium tin oxide, indium zinc oxide, or combinations thereof.

At least a bottom surface 107 of the upper portion 110B is wider than a top surface 105 of the lower portion 110A to form an overhang 109. The bottom surface 107 larger than the top surface 105 forming the overhang 109 allows for the upper portion 110B to shadow the lower portion 110A. The shadowing of the overhang 109 provides for evaporation deposition each of the OLED material 112 and a cathode 114.

The OLED material 112 may include one or more of a HIL, a HTL, an EML, and an ETL. The OLED material 112 is disposed on the metal layer 104. In some embodiments, which can be combined with other embodiments described herein, the OLED material 112 is disposed on the metal layer 104 and over a portion of the PDL structures 126. The cathode 114 is disposed over the OLED material 112 of the PDL structures 126 in each sub-pixel 106. The cathode 114 may be disposed on a portion of a sidewall 111 of the lower portion 110A. The cathode 114 includes a conductive material, such as a metal, e.g., the cathode 114 includes chromium, titanium, aluminum, ITO, or a combination thereof. In other embodiments, which can be combined with other embodiments described herein, the OLED material 112 and the cathode 114 are disposed over a top surface 115 of the upper portion 110B of the inorganic overhang structures 110.

Each sub-pixel 106 includes include an encapsulation layer 116. The encapsulation layer 116 may be or may correspond to a local passivation layer. The encapsulation layer 116 of a respective sub-pixel is disposed over the cathode 114 (and OLED material 112) with the encapsulation layer 116 extending under at least a portion of each of the inorganic overhang structures 110 and along a sidewall of each of the inorganic overhang structures 110. The encapsulation layer 116 is disposed over the cathode 114 and over at least the sidewall 111 of the lower portion 110A. In some embodiments, which can be combined with other embodiments described herein, the encapsulation layer 116 is disposed over the sidewall 113 of the upper portion 110B. In some embodiments, which can be combined with other embodiments described herein, the encapsulation layer 116 is disposed over the top surface 115 of the upper portion 110B of the inorganic overhang structures 110. The encapsulation layer 116 can include a non-conductive inorganic material, such as the silicon-containing material. The silicon-containing material may include $Si_3N_4$ containing materials.

The sub-pixel circuit 100 can include at least a global passivation layer 120 disposed over the inorganic overhang structures 110 and the encapsulation layers 116. The global passivation layer 120 can include a non-conductive inorganic material, such as the silicon-containing material. The silicon-containing material may include $Si_3N_4$ containing materials.

FIG. 2 is a flow a flow diagram of an on-demand method 200 for forming a sub-pixel circuit 100. FIGS. 3A-3I are schematic, cross-sectional views of a substrate 102 during the method 200 for forming the sub-pixel circuit 100 according embodiments described herein.

Figures 3A, 3B:
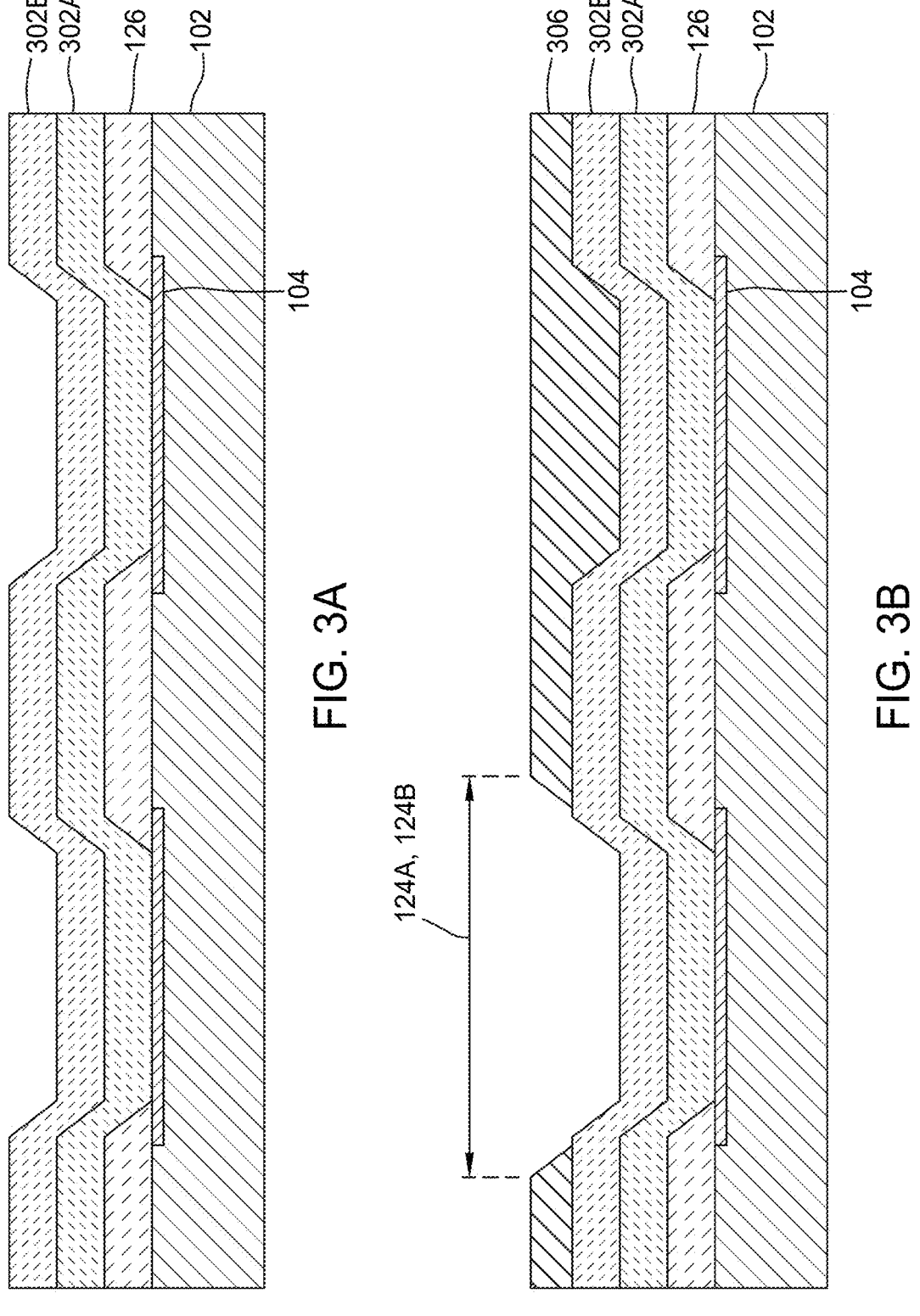
FIGS. 3A-3I are schematic, cross-sectional views of a substrate during a method for forming a sub-pixel circuit, according embodiments described herein.

At operation 202, as shown in FIG. 3A, a lower portion layer 302A and an upper portion layer 302B are deposited over the substrate 102. The lower portion layer 302A is disposed over the PDL structures 126 and the metal layers 104. The upper portion layer 302B is disposed over the lower portion layer 302A. In various embodiments, the lower portion layer 302A corresponds to the lower portion 110A and the upper portion layer 302B corresponds to the upper portion 110B of the inorganic overhang structures 110. In some embodiments, an assistant cathode layer 304 is disposed between the lower portion layer 302A and the PDL structures 126 and the metal layers 104.

At operation 204, as shown in FIG. 3B, a first resist 306 is disposed and patterned. The first resist 306 is disposed over the upper portion layer 302B. The first resist 306 is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the first resist 306 determines whether the resist is a positive resist or a negative resist. The first resist 306 is patterned to form one of a pixel opening 124A of a first sub-pixel 108*a*. The patterning is one of a photolithography, digital lithography process, or laser ablation process.

Figures 3C, 3D:
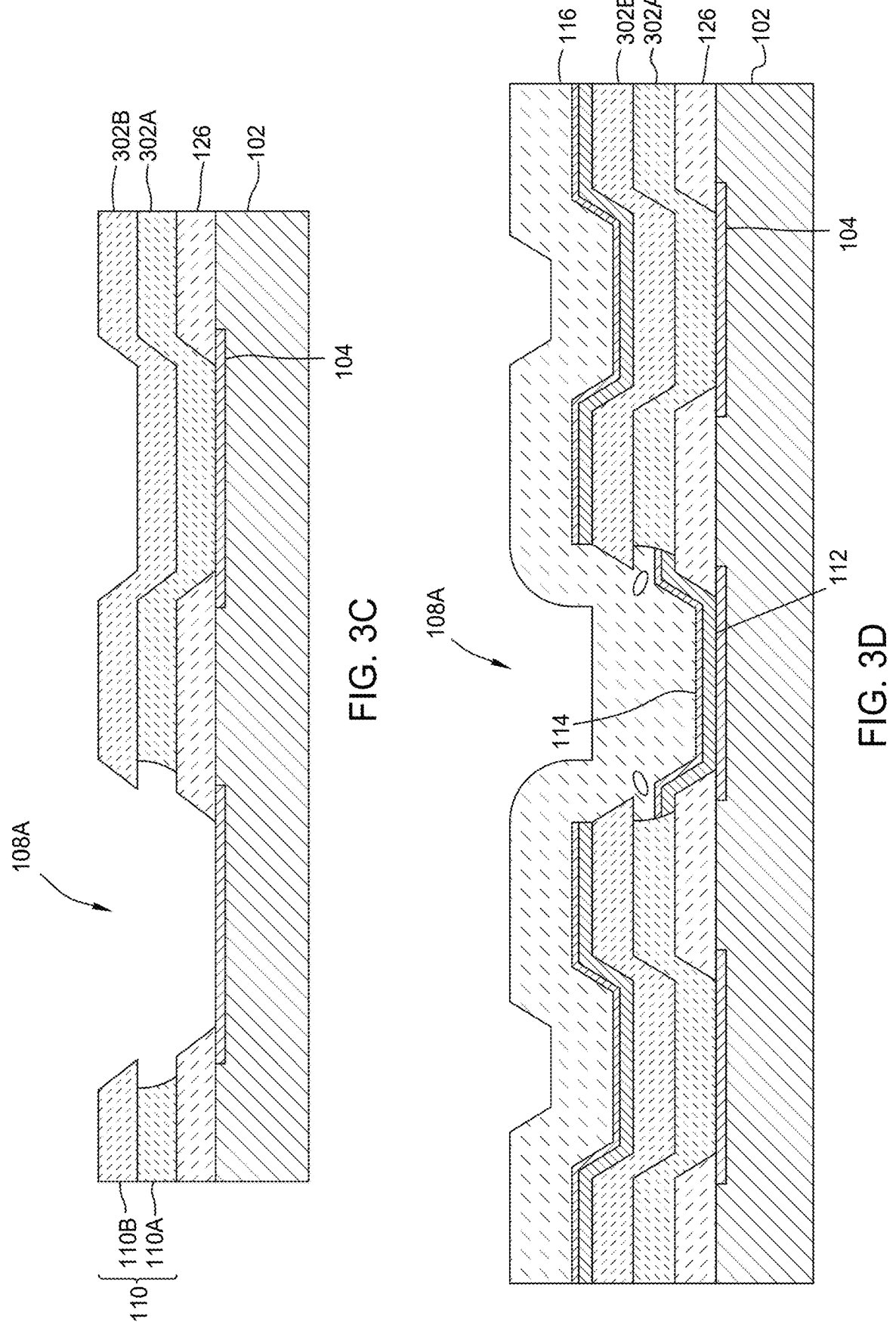

At operation 206, as shown in FIG. 3C, portions of the upper portion layer 302B and the lower portion layer 302A exposed by the pixel opening 124A, 124B are removed. The upper portion layer 302B exposed by the pixel opening 124A, 124B may be removed by a dry etch process. The lower portion layer 302A exposed by the pixel opening 124A, 124B may be removed by a wet etch process. In embodiments including the assistant cathode layer 304, a portion of the assistant cathode layer 304 may be removed by a dry etch process or a wet etch process to form an assistant cathode (not shown) disposed under the lower portion 110A. Operation 206 forms the inorganic overhang structures 110 of the first sub-pixel 108a. The etch selectivity of the materials of the upper portion layer 302B (corresponding to the upper portion 110B) and the lower portion layer 302A (corresponding to the lower portion 110A) coupled with the etch processes can remove the exposed portions of the upper portion layer 302B and the lower portion layer 302A. This can provide for the bottom surface 107 of the upper portion 110B being wider than the top surface 105 of the lower portion 110A, thereby forming the overhang 109 (as shown in FIG. 1).

At operation 208, as shown in FIG. 3D, the OLED material 112 of the first sub-pixel 108a, the cathode 114, and the encapsulation layer 116 are deposited. In some embodiments, the OLED material 112 does not contact the lower portion 110A and the cathode 114 contacts the lower portion 110A of the inorganic overhang structures 110. The encapsulation layer 116 is deposited over the cathode 114. In embodiments including capping layers (not shown), the capping layers are deposited between the cathode 114 and the encapsulation layer 116. The capping layers may be deposited by evaporation deposition.

Figure 3E:
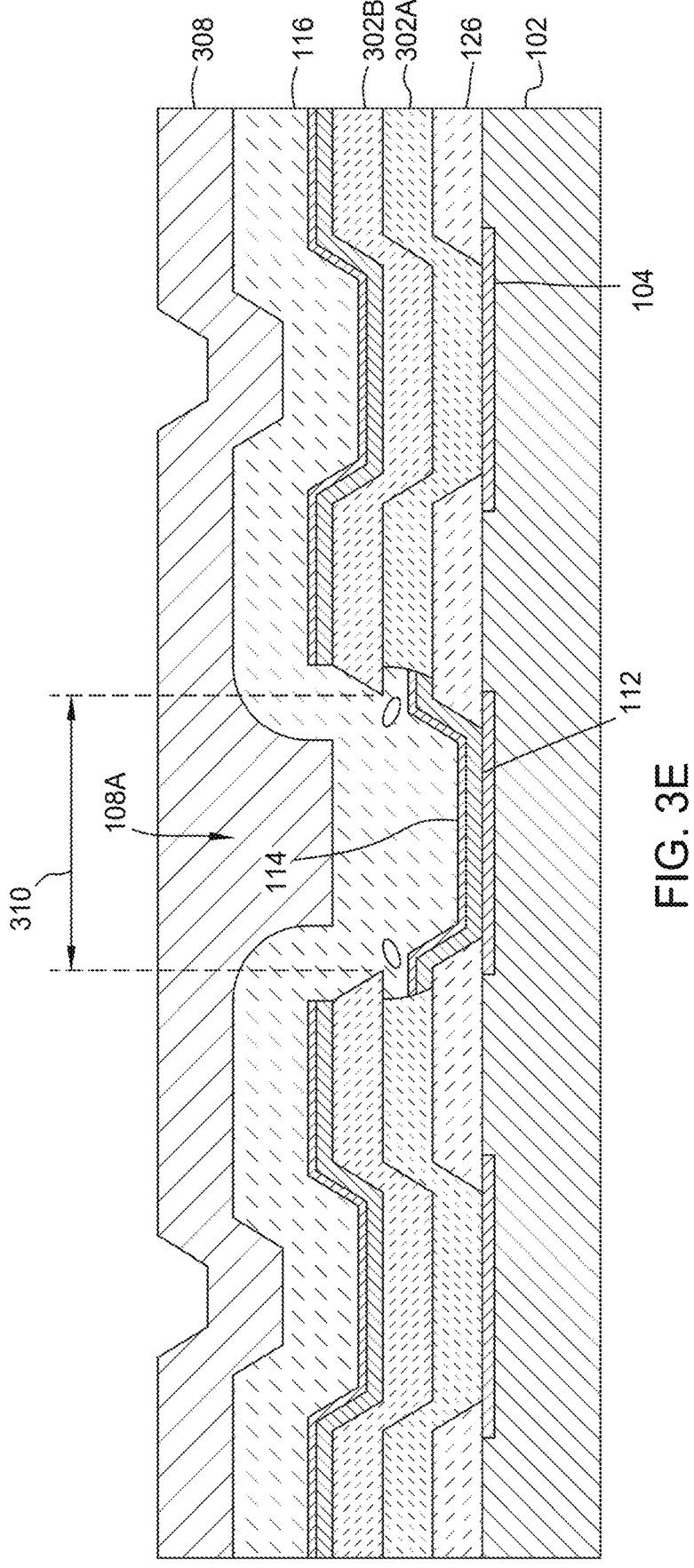
Figure 3F:
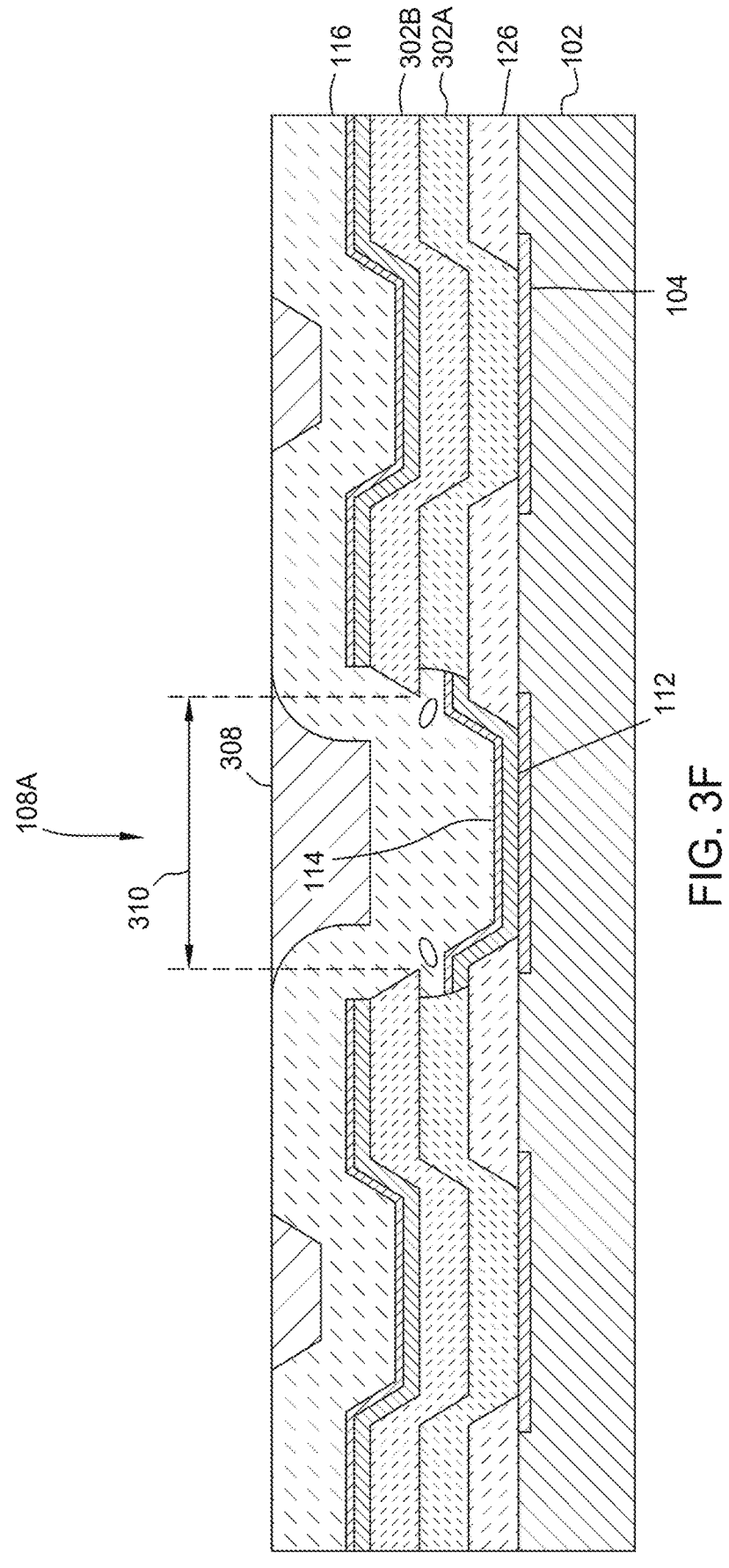

At operation 210, as shown in FIG. 3E, a second resist 308 is formed in a well 310 of the first sub-pixel 108a and over the encapsulation layer 116 disposed on the top layer 302B. The second resist 308 can be formed in the well 310, in which the second resist 308 can fill the sub-pixel and produce a second resist thickness of about 0.1 μm to about 10 μm, e.g., about 0.1 μm to about 8 μm, about 0.5 μm to about 5 μm, or about 0.9 μm to about 1.1 μm, over the upper portion 110B. At operation 212, as shown in FIG. 3F, a portion of the second resist 308 can be removed, wherein the portion of the second resist 308 that is removed is disposed outside of the well 310. For example, the portion of the second resist 308 that is removed can include the portion of the second resist 308 that is disposed over the top layer 302B. The second resist 308 may be removed by a plasma ashing process.

Figures 3G, 3H:
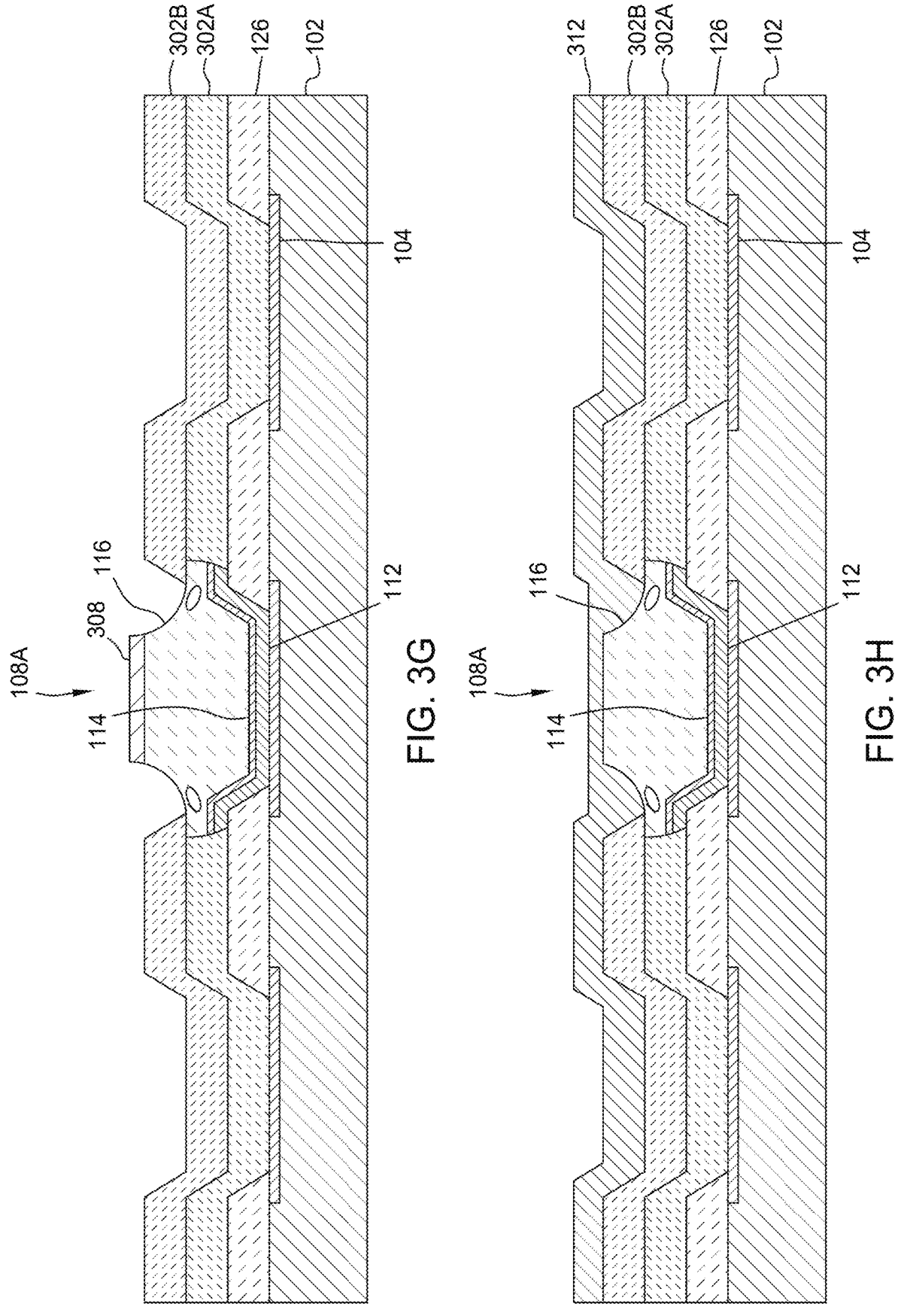

At operation 214, as shown in FIG. 3G, the encapsulation layer 116 and a residual portion of the second resist 308 remaining in the well 310 is etched. The encapsulation layer 116 and the residual portion of the second resist 308 remaining in the well 310 can be etched by a dry etching process, e.g., $SF_6$ etching. In some embodiments, the dry etching process can produce a gap between the second resist 308 and the top layer 302B, where the encapsulation layer 116 includes a lateral portion and a central portion. The lateral portion can include an arcuate surface leading to the second resist 308, as shown in FIG. 3G. The central portion can be substantially planar.

In some embodiments, at operation 216, as shown in FIG. 3H, a global passivation layer 312 can be deposited over the encapsulation layer 116 and the top layer 302B. The global passivation layer 312 can include any of the global passivation layers as described in the present disclosure. The global passivation layer 312 can include a thickness of about 1 nm to about 3 μm, e.g., about 1 nm to about 1.8 μm, about 120 nm to about 1.5 μm, or about 500 nm to about 1 μm. In some embodiments, the global passivation layer 312 can include one or more non-conductive inorganic materials, such as the silicon-containing material. The silicon-containing material may include $Si_3N_4$ containing materials. Without being bound by theory, the global passivation layer 312 can have a uniform thickness across the top layer 302B.

Figure 3I:
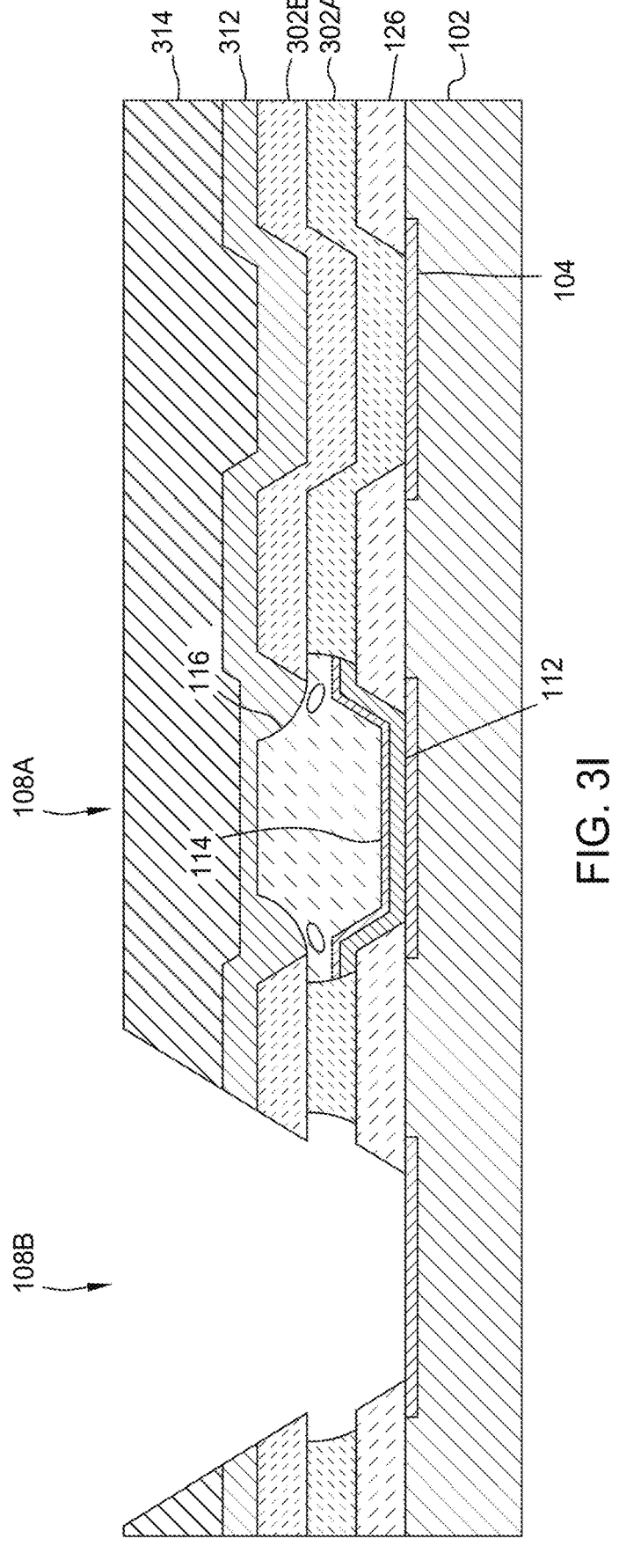

At operation 218, referring to FIG. 3I, a third resist 314 is deposited over the encapsulation layer 116 and/or the global passivation layer 312. The third resist 314 can include the first resist 306. The third resist 314 is disposed over the upper portion layer 302B. The third resist 314 is a positive resist or a negative resist. The third resist 314 is patterned to form one of a pixel opening 124B of a second sub-pixel 108B. The patterning is one of a photolithography, digital lithography process, or laser ablation process.

In some embodiments, which can be combined with other embodiments, operations 202-218 can be iteratively repeated to provide for the formation of a plurality of sub-pixels. Each sub-pixel of the plurality of sub-pixels can include an OLED for a specific color, e.g., white, green, red, blue, or a combination thereof.

Figure 4A:
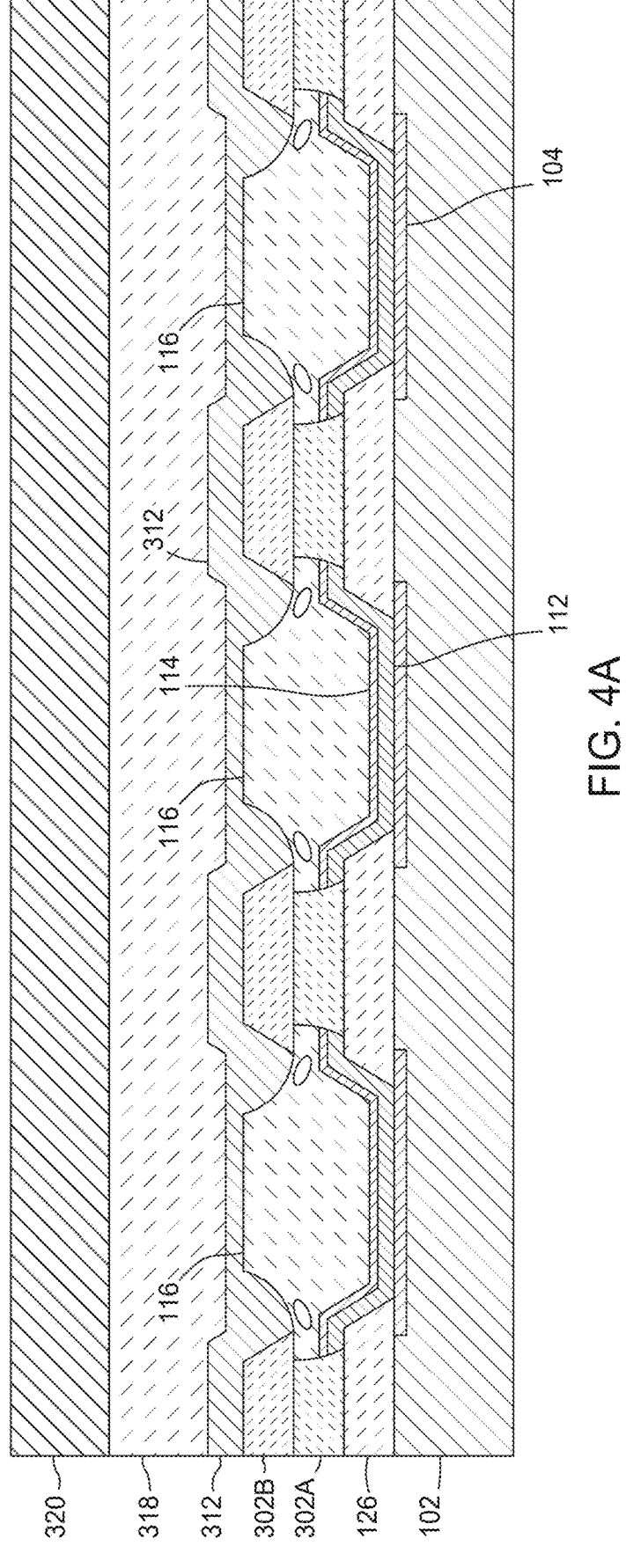
FIGS. 4A-4C are schematic, cross-sectional views of exemplary sub-pixel circuits, according to embodiments described herein.
Figure 4B:
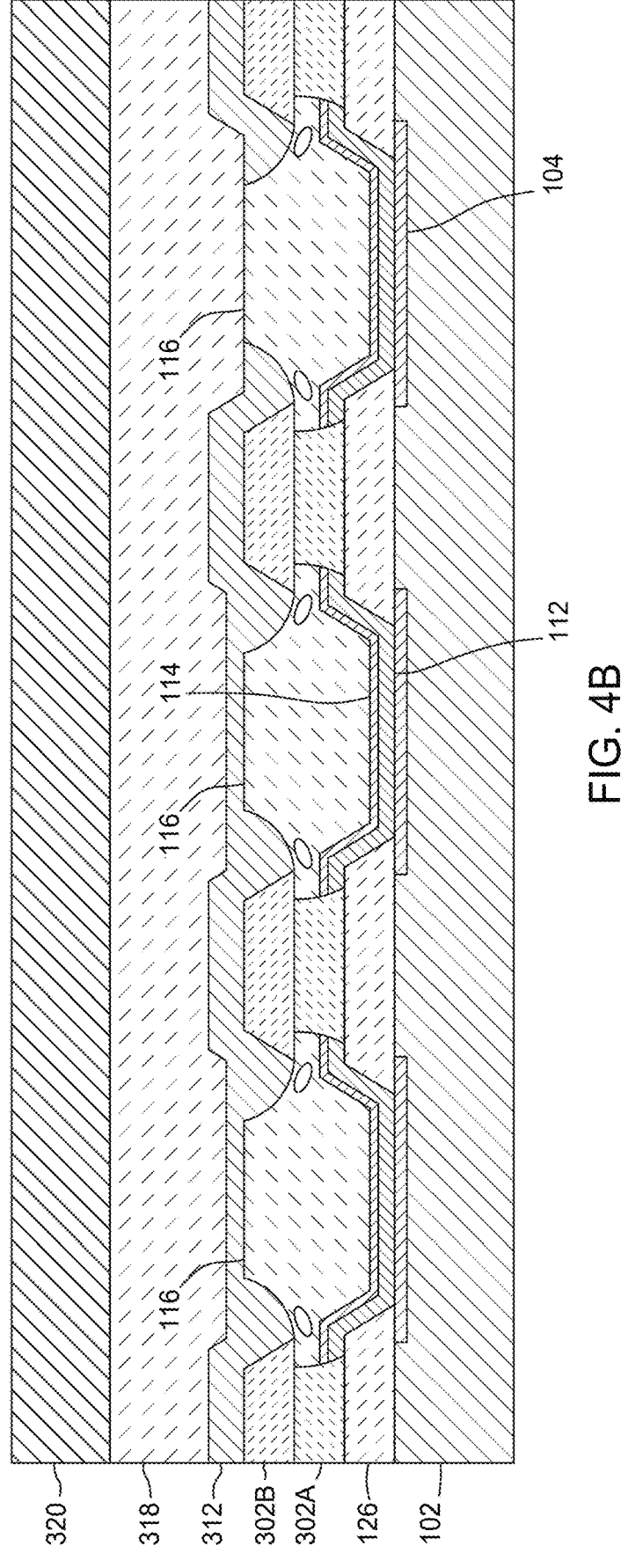
Figure 4C:
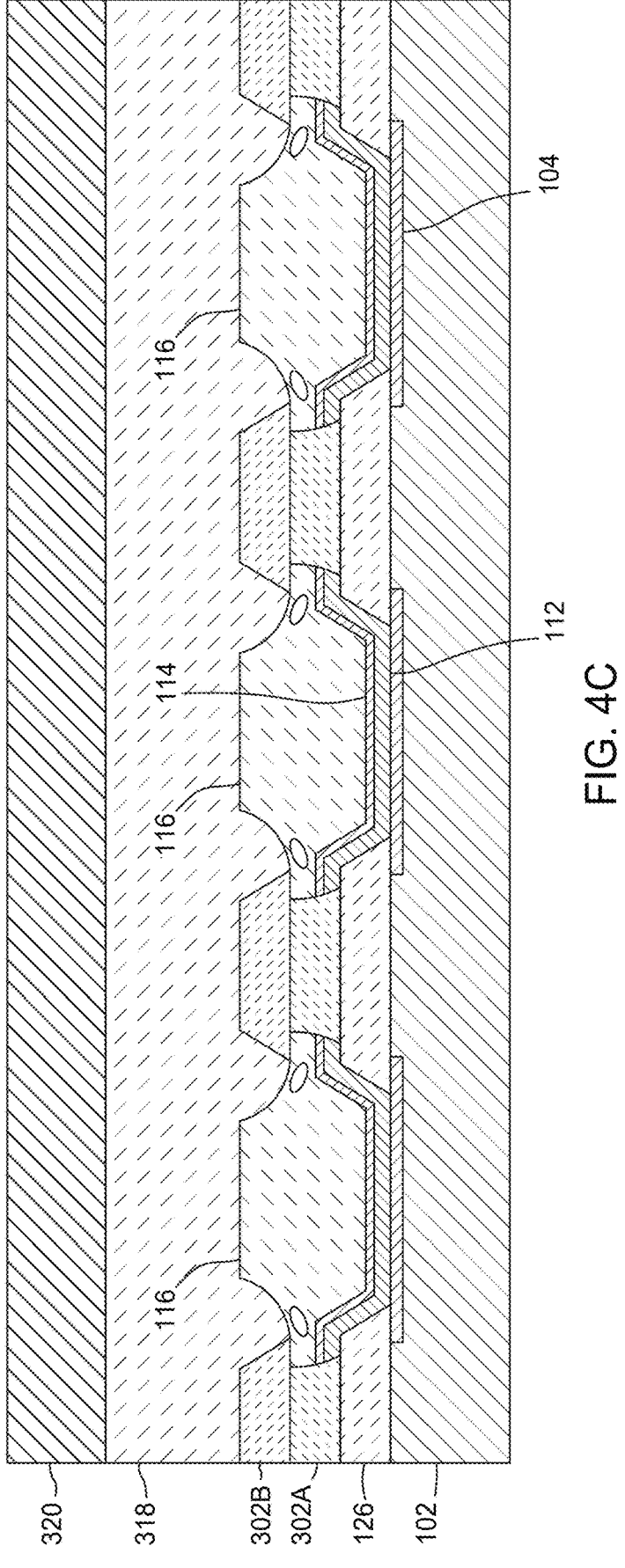

In some embodiments, an intermediate layer 318 may be deposited over the global passivation layer 312, as shown in FIG. 4A. The intermediate layer 318 can include a monomer and/or a polymer, e.g., an inorganic polymer or an organic polymer that can be ink-jet printed on the global passivation layer 312. In some embodiments, the intermediate layer 318 can include a thickness of about 1 μm to about 10 μm, e.g., about 1 μm to about 5 μm, about 2 μm to about 8 μm, or about 4 μm to about 6 μm. In some embodiments, the global passivation layer 312 can include a similar thickness over the inorganic overhang structures 110, while the global passivation layer 312 can include a different thickness over the plurality of sub-pixels 106, e.g., the first sub-pixel 108a, the second sub-pixel 108b, and the third sub-pixel 108c. In some embodiments, an intermediate layer 318 may be deposited over the global passivation layer 312 and/or the encapsulation layer 116, as shown in FIG. 4B. In some embodiments, an intermediate layer 318 may be deposited over the encapsulation layer 116, as shown in FIG. 4C. A second encapsulation layer 320 may be deposited over the intermediate layer 318.

Figure 5:
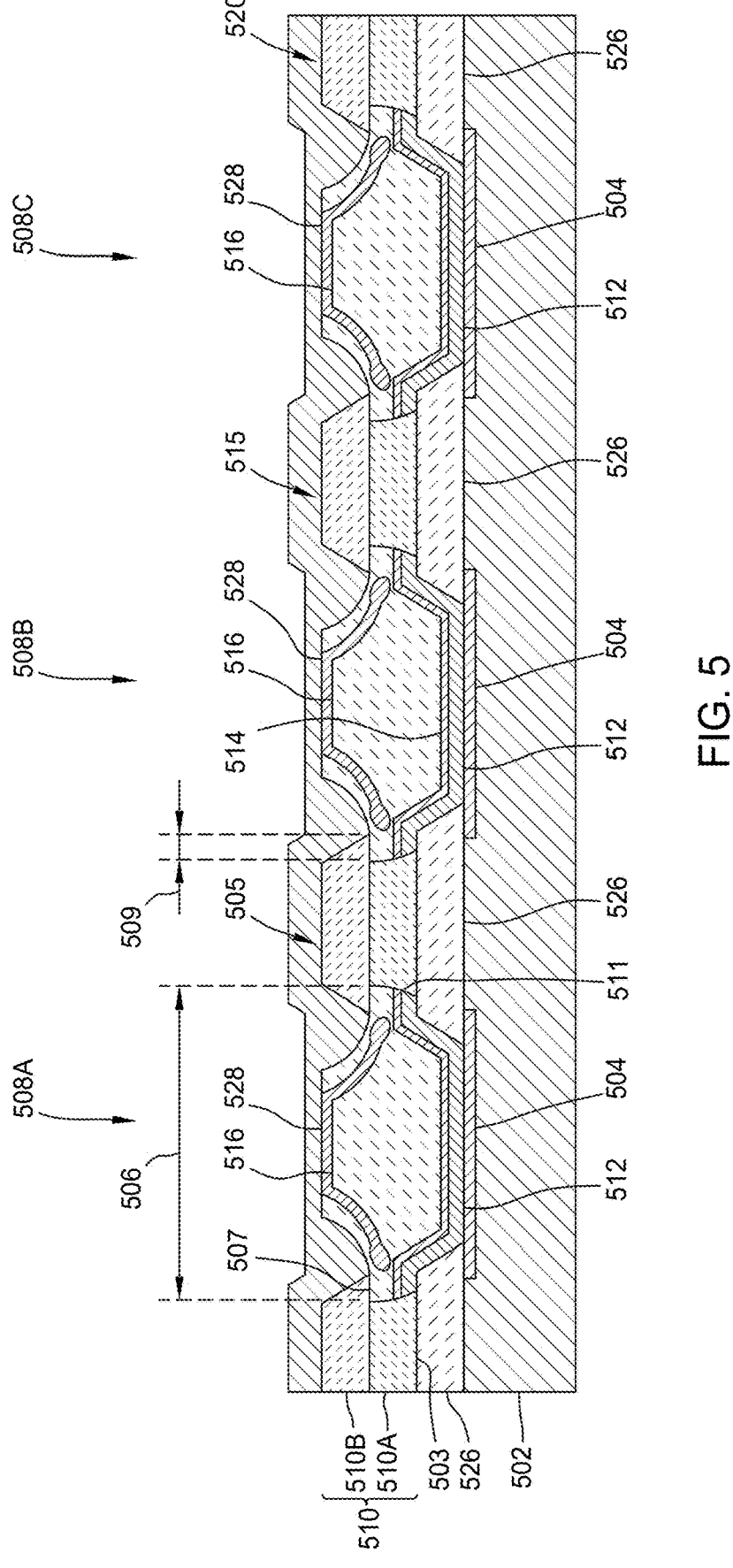
FIG. 5 is a schematic, cross-sectional view of a sub-pixel circuit for an organic light-emitting diode (OLED) display, according to embodiments described herein

FIG. 5 is a schematic, cross-sectional view of a sub-pixel circuit 500. The sub-pixel circuit 500 includes a substrate 502. Metal layers 504 may be patterned on the substrate 502 and are defined by adjacent pixel-defining layer (PDL) structures 526 disposed on the substrate 502. In one embodiment, which can be combined other embodiments described herein, the metal layers 504 are pre-patterned on the substrate 502, e.g., the substrate 502 is a pre-patterned indium tin oxide (ITO) glass substrate. The metal layers 504 are configured to operate anodes of respective sub-pixels. In some embodiments, the metal layers 504 are a layer stack of a first transparent conductive oxide (TCO) layer, a second metal layer disposed on the first TCO layer, and a third TCO layer disposed on the second metal layer. The metal layers 504 include, but are not limited to, chromium, titanium, gold, silver, copper, aluminum, ITO, a combination thereof, or other suitably conductive materials.

The PDL structures 526 are disposed on the substrate 502. The PDL structures 526 include one of an organic material, an organic material with an inorganic coating disposed thereover, or an inorganic material. The organic material of the PDL structures 526 includes, but is not limited to, polyimides. The inorganic material of the PDL structures 526 includes, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent PDL structures 526 define a respective sub-pixel and expose the anode (i.e., metal layer 504) of the respective sub-pixel of the sub-pixel circuit 500.

The sub-pixel circuit 500 has a plurality of sub-pixels 506 including at least a first sub-pixel 508A, a second sub-pixel 508B, and a third sub-pixel 508C. While the Figures depict the first sub-pixel 508A, the second sub-pixel 508b, and the third sub-pixel 508C, the sub-pixel circuit 500 of the embodiments described herein may include three or more sub-pixels 506, such as a fourth and a fifth sub-pixel. Each sub-pixel 506 has an OLED material 512 configured to emit a white, red, green, blue or other color light when energized, e.g., the OLED material 512 of the first sub-pixel 508A emits a green light when energized, the OLED material of the second sub-pixel 508B emits a red light when energized, the OLED material of the third sub-pixel 508C emits a blue light when energized, and the OLED material of a fourth sub-pixel emits a other color light when energized Inorganic overhang structures 510 are disposed on an upper surface 503 of each of the PDL structures 526. The inorganic overhang structures 510 are permanent to the sub-pixel circuit. The inorganic overhang structures 510 further define each sub-pixel 506 of the sub-pixel circuit 500. The inorganic overhang structures 510 include at least an upper portion 510B disposed on a lower portion 510A. A first configuration of the inorganic overhang structures 510 includes the upper portion 510B of a non-conductive inorganic material and the lower portion 510A of a conductive inorganic material. A second configuration of the inorganic overhang structures 510 includes the upper portion 510B of a conductive inorganic material and the lower portion 510A of a conductive inorganic material. A third configuration of the inorganic overhang structures 510 includes the upper portion 510B of a non-conductive inorganic material, the lower portion 510A of a non-conductive inorganic material, and an optional assistant cathode (not shown) disposed under the lower portion 510A. A fourth configuration of the inorganic overhang structures 510 includes the upper portion 510B of a conductive inorganic material, the lower portion 510A of a non-conductive inorganic material, and an optional assistant cathode (not shown) disposed under the lower portion 510A. The first, second, third, and fourth exemplary embodiments of the sub-pixel circuit 500 include inorganic overhang structures 510 of at least one of the first, second, third, or fourth configurations. The inorganic overhang structures 510 are able to remain in place, e.g., are permanent.

The non-conductive inorganic material can include an inorganic silicon-containing material, e.g., the silicon-containing material includes oxides or nitrides of silicon, or combinations thereof. The conductive inorganic material includes, but it not limited to, a metal-containing material, e.g., the metal-containing material includes copper, titanium, aluminum, molybdenum, silver, indium tin oxide, indium zinc oxide, or combinations thereof.

At least a bottom surface 507 of the upper portion 510B is wider than a top surface 505 of the lower portion 510A to form an overhang 509. The bottom surface 507 larger than the top surface 505 forming the overhang 509 allows for the upper portion 510B to shadow the lower portion 510A. The shadowing of the overhang 509 provides for evaporation deposition each of the OLED material 512 and a cathode 514.

The OLED material 512 may include one or more of a HIL, a HTL, an EML, and an ETL. The OLED material 512 is disposed on the metal layer 504. In some embodiments, which can be combined with other embodiments described herein, the OLED material 512 is disposed on the metal layer 504 and over a portion of the PDL structures 526. The cathode 514 is disposed over the OLED material 512 of the PDL structures 526 in each sub-pixel 506. The cathode 514 may be disposed on a portion of a sidewall 511 of the lower portion 510A. The cathode 514 includes a conductive material, such as a metal, e.g., the cathode 514 includes chromium, titanium, aluminum, ITO, or a combination thereof. In other embodiments, which can be combined with other embodiments described herein, the OLED material 512 and the cathode 514 are disposed over a top surface 515 of the upper portion 510B of the inorganic overhang structures 510.

Each sub-pixel 506 includes include an encapsulation layer 516. The encapsulation layer 516 may be or may correspond to a local passivation layer. The encapsulation layer 516 of a respective sub-pixel is disposed over the cathode 514 (and OLED material 512) with the encapsulation layer 516 extending under at least a portion of each of the inorganic overhang structures 510 and along a sidewall of each of the inorganic overhang structures 510. The encapsulation layer 516 is disposed over the cathode 514 and over at least the sidewall 511 of the lower portion 510A. In some embodiments, which can be combined with other embodiments described herein, the encapsulation layer 516 is disposed over the sidewall 513 of the upper portion 510B. In some embodiments, which can be combined with other embodiments described herein, the encapsulation layer 516 is disposed over the top surface 515 of the upper portion 510B of the inorganic overhang structures 510. The encapsulation layer 516 can include a non-conductive inorganic material, such as the silicon-containing material. The silicon-containing material may include $Si_3N_4$ containing materials.

Each sub-pixel 506 includes a resist 528 disposed within a cavity of the encapsulation layer 516. The resist 528 can include any of the resist described in the present disclosure. Without being bound by theory, the resist 528 can fill the cavity of the encapsulation layer 516 to prevent sub-pixel damage during one or more etching or processing steps, as described below, with reference to FIG. 6. For example, the resist 528 can protect one or more sub-pixels previously processed from damage during a subsequent sub-pixel formation, e.g., during plasma ashing, dry etching, wet etching, or a combination thereof.

The sub-pixel circuit 500 can include at least a global passivation layer 520 disposed over the inorganic overhang structures 510, the resist 528, and/or the encapsulation layers 516. The global passivation layer 520 can include a non-conductive inorganic material, such as the silicon-containing material. The silicon-containing material may include $Si_3N_4$ containing materials.

FIG. 6 is a flow a flow diagram of an on-demand method 600 for forming a sub-pixel circuit 500. FIGS. 7A-7I are schematic, cross-sectional views of a substrate 502 during the method 600 for forming the sub-pixel circuit 500 according embodiments described herein.

Figures 7A, 7B:
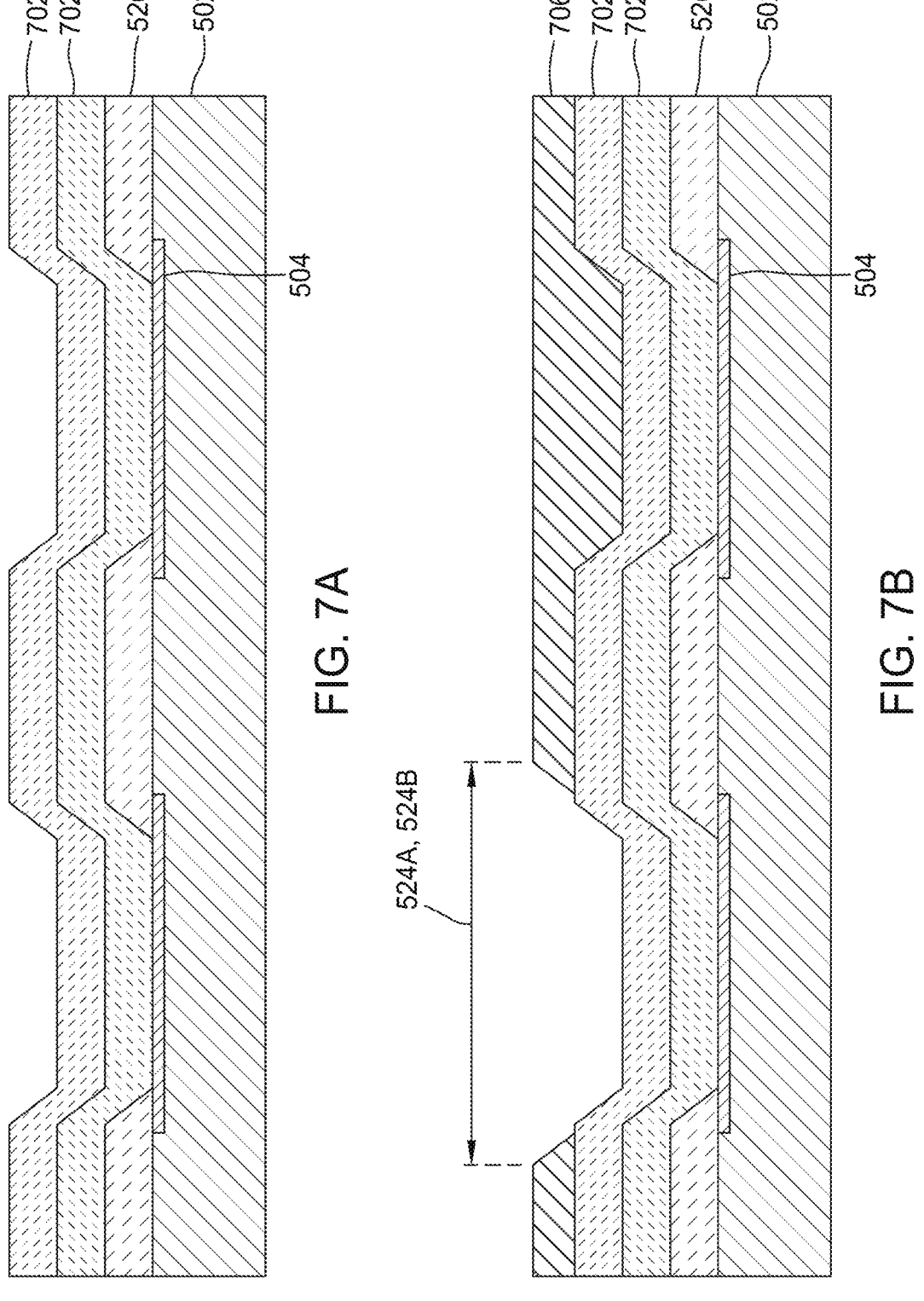
FIGS. 7A-7I are schematic, cross-sectional views of a substrate during a method for forming a sub-pixel circuit, according embodiments described herein.

At operation 602, as shown in FIG. 7A, a lower portion layer 702A and an upper portion layer 702B are deposited over the substrate 502. The lower portion layer 702A is disposed over the PDL structures 526 and the metal layers 504. The upper portion layer 702B is disposed over the lower portion layer 702A. The lower portion layer 702A corresponds to the lower portion 510A, and the upper portion layer 702B corresponds to the upper portion 510B of the inorganic overhang structures 510. In some embodiments, an assistant cathode layer 704 is disposed between the lower portion layer 702A and the PDL structures 526 and the metal layers 504.

At operation 604, as shown in FIG. 7B, a first resist 706 is disposed and patterned. The first resist 706 is disposed over the upper portion layer 702B. The first resist 706 is a positive resist or a negative resist. The first resist 706 is patterned to form one of a pixel opening 524A of a first sub-pixel 508a. The patterning is one of a photolithography, digital lithography process, or laser ablation process.

Figures 7C, 7D:
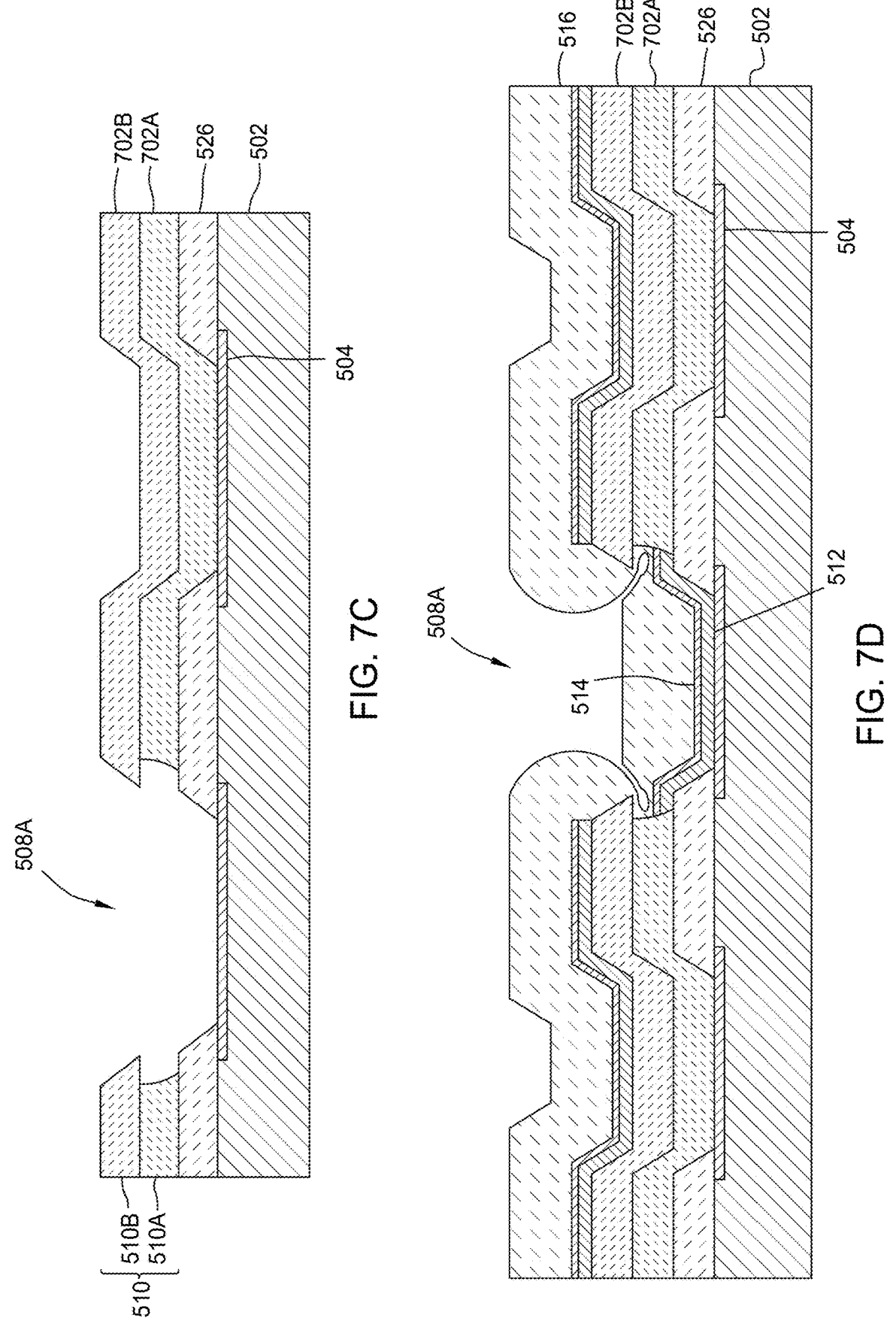

At operation 606, as shown in FIG. 7C, portions of the upper portion layer 702B and the lower portion layer 702A exposed by the pixel opening 524A, 524B are removed. The upper portion layer 702B exposed by the pixel opening 524A, 524B may be removed a dry etch process. The lower portion layer 702A exposed by the pixel opening 524A, 524B may be removed by a wet etch process. In embodiments including the assistant cathode layer 704, a portion of the assistant cathode layer 704 may be removed by a dry etch process or a wet etch process to form an assistant cathode layer 704 disposed under the lower portion 510A. Operation 606 forms the inorganic overhang structures 510 of the first sub-pixel 508a. The etch selectivity of the materials of the upper portion layer 702B (corresponding to the upper portion 510B) and the lower portion layer 702A (corresponding to the lower portion 510A) coupled with the etch processes can remove the exposed portions of the upper portion layer 702B and the lower portion layer 702A. This can provide for the bottom surface 507 of the upper portion 510B being wider than the top surface 505 of the lower portion 510A, thereby forming the overhang 509 (as shown in FIG. 5).

At operation 608, as shown in FIG. 7D, the OLED material 512 of the first sub-pixel 508a, the cathode 514, and the encapsulation layer 516 are deposited. In some embodiments, the OLED material 512 does not contact the lower portion 510A and the cathode 514 contacts the lower portion 510A of the inorganic overhang structures 510. The encapsulation layer 516 is deposited over the cathode 514. In embodiments including capping layers (not shown), the capping layers are deposited between the cathode 514 and the encapsulation layer 516. The capping layers may be deposited by evaporation deposition.

Figure 7E:
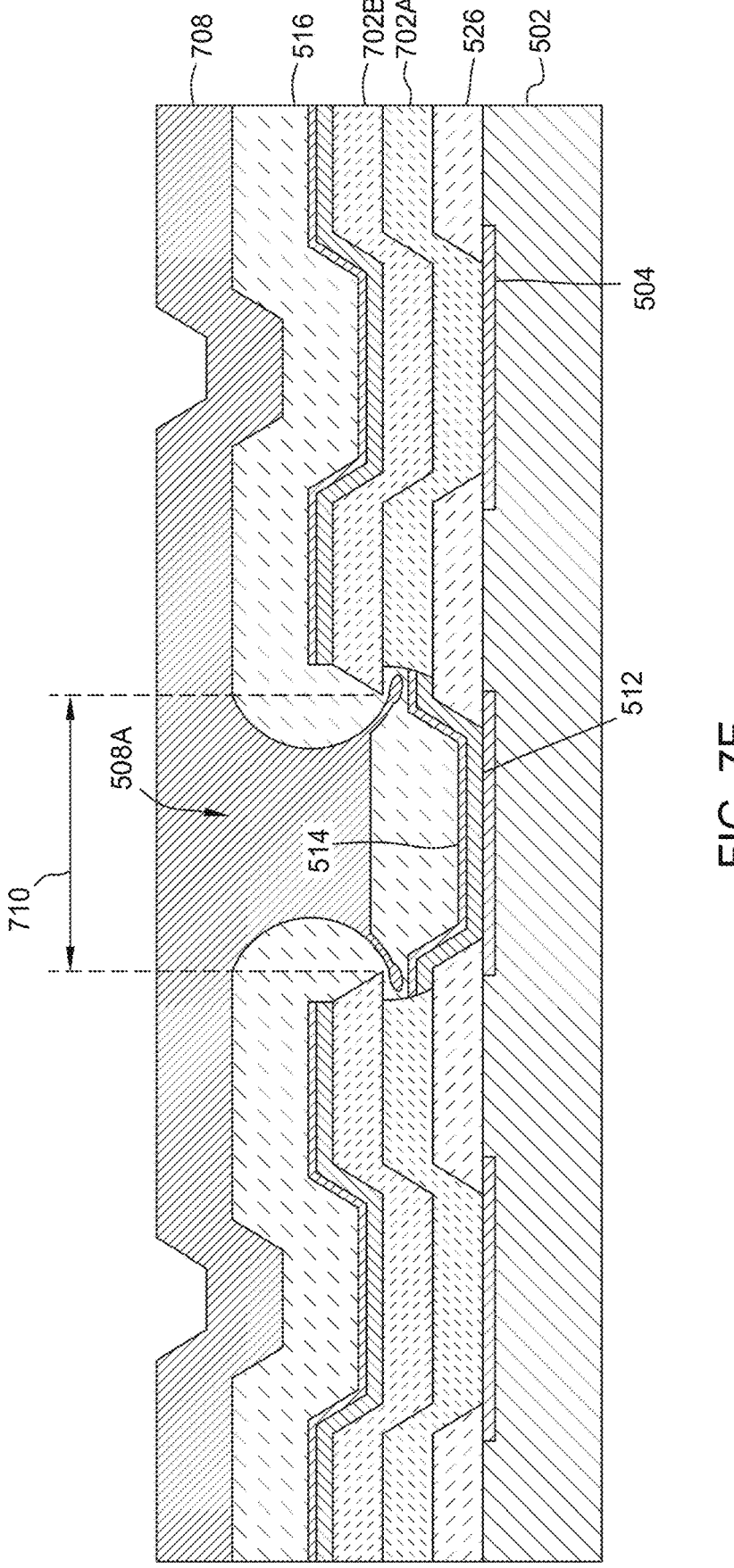
Figure 7F:
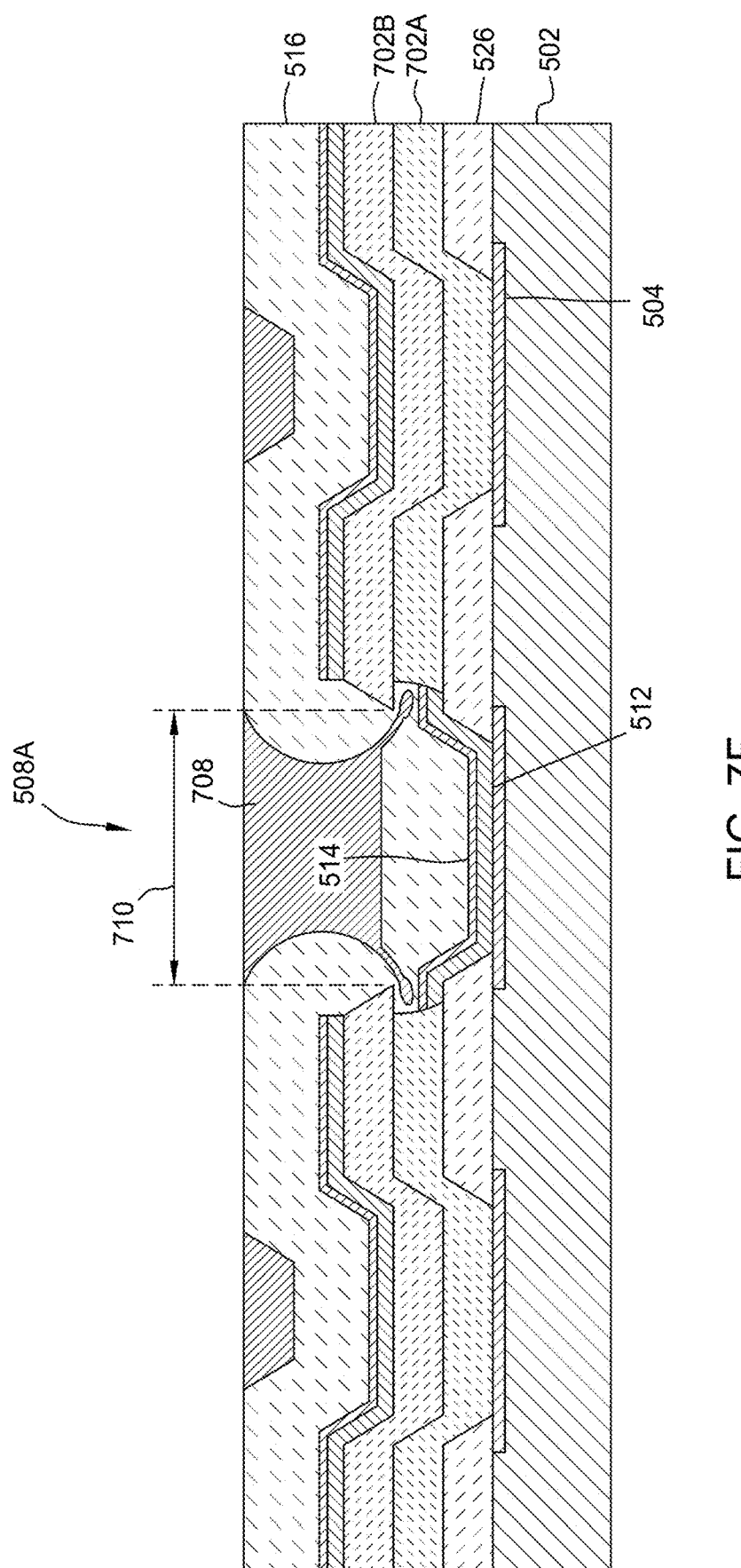

At operation 610, as shown in FIG. 7E, a second resist 708 is formed in a well 710 of the first sub-pixel 508a and over the encapsulation layer 516 disposed on the top layer 702B. The second resist 708 can be formed in the well 710, in which the second resist 708 can fill the sub-pixel the well and one or more cavities within the encapsulation layer 516, which are formed due to the overhang 509. The second resist 708 can include a second resist thickness of about 0.1 µm to about 10 µm, e.g., about 0.1 µm to about 8 µm, about 0.5 µm to about 5 µm, or about 0.9 µm to about 1.1 µm, over the upper portion 510B. At operation 612, as shown in FIG. 7F, a portion of the second resist 708 can be removed, wherein the portion of the second resist 708 that is removed is disposed outside of the well 710. For example, the portion of the second resist 708 that is removed can include the portion of the second resist 708 that is disposed over the top layer 702B. The second resist 708 may be removed by a plasma ashing process.

Figures 7G, 7H:
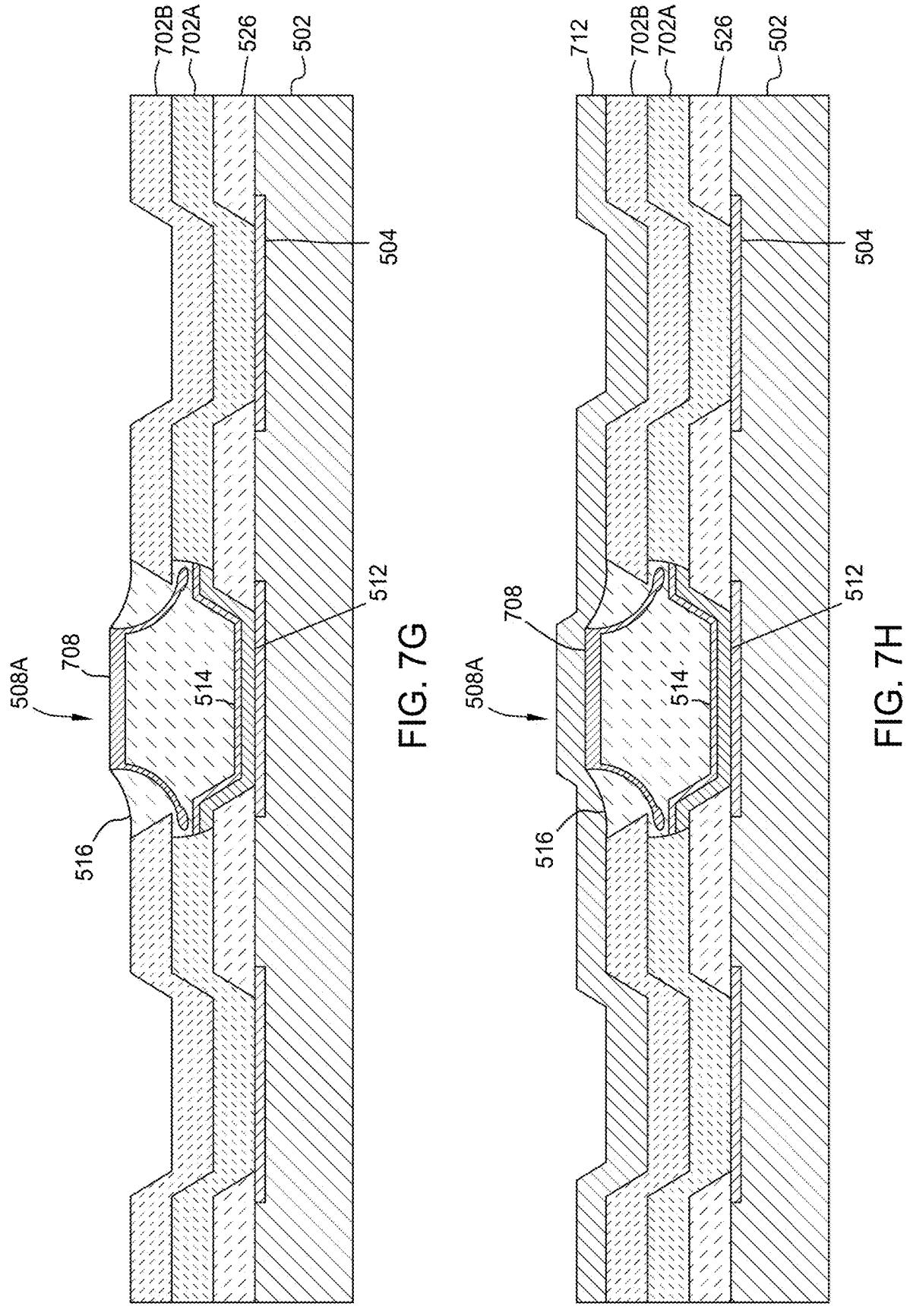

At operation 614, as shown in FIG. 7G, the encapsulation layer 516 and a residual portion of the second resist 708 remaining in the well 710 is etched. The encapsulation layer 516 and the residual portion of the second resist 708 in the well 710 can be etched by a dry etching process, e.g., SF$_6$ etching. In some embodiments, a cavity of the encapsulation layer 516 remains filled with a residual portion of the second resist 708. In some embodiments, the dry etching process can produce a gap between the second resist 708 and the top layer 702B, where the encapsulation layer 516 includes a lateral portion and a central portion. The lateral portion can include an arcuate surface leading to the second resist 708, as shown in FIG. 7G. The central portion can be substantially planar.

In some embodiments, at operation 616, as shown in FIG. 7H, a global passivation layer 712 can be deposited over the encapsulation layer 516, the second resist 708, and the top layer 702B. The global passivation layer 712 can include any of the global passivation layer as described in the present disclosure. The global passivation layer 712 can include a thickness of about 1 nm to about 3 µm, e.g., about 1 nm to about 1.8 µm, about 120 nm to about 1.5 µm, or about 500 nm to about 1 µm. In some embodiments, the global passivation layer 712 can include one or more nonconductive inorganic materials, such as the silicon-containing material. The silicon-containing material may include Si$_3$N$_4$ containing materials. Without being bound by theory, the global passivation layer 712 can have a uniform thickness across the top layer 702B.

Figure 7I:
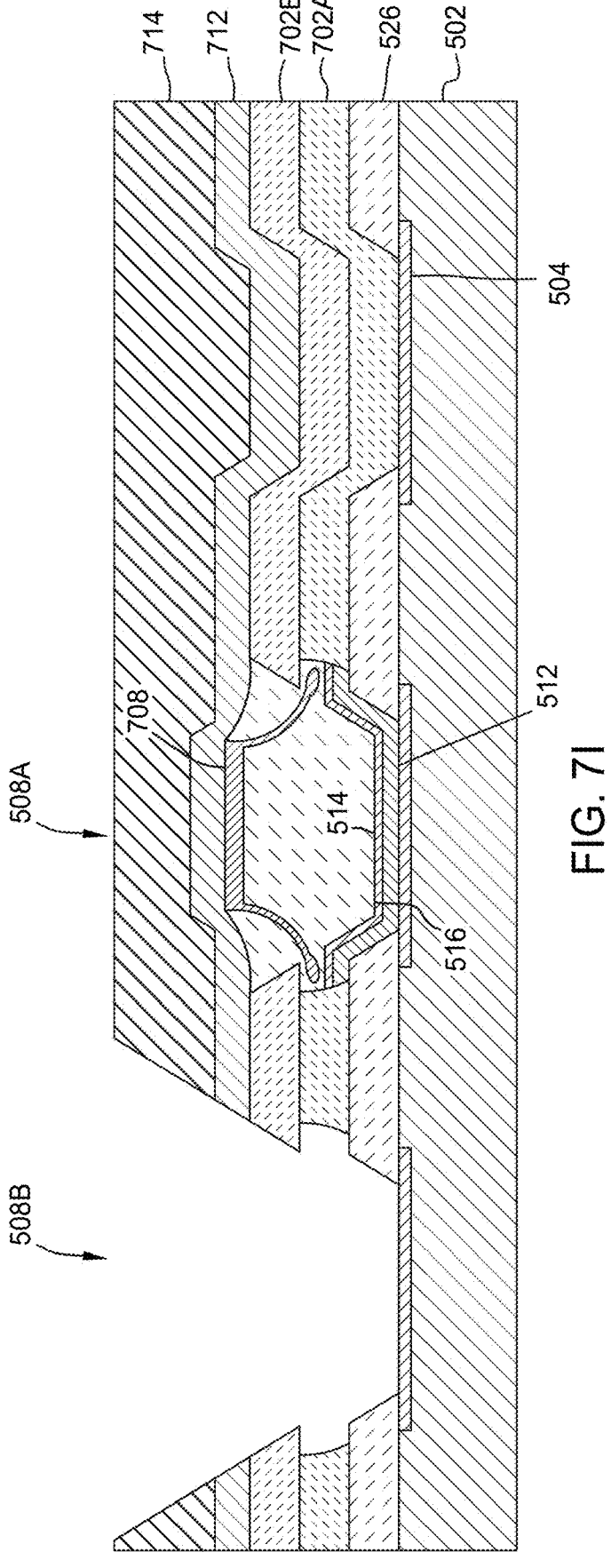

At operation 618, referring to FIG. 7I, a third resist 714 is deposited over the encapsulation layer 516 and/or the global passivation layer 712. The third resist 714 can include any of the first resist 706. The third resist 714 is disposed over the upper portion layer 702B. The third resist 714 is a positive resist or a negative resist. The third resist 714 is patterned to form one of a pixel opening 524B of a second sub-pixel 508B. The patterning is one of a photolithography, digital lithography process, or laser ablation process.

In some embodiments, which can be combined with other embodiments, operations 602-618 can be iteratively repeated to provide for the formation of a plurality of sub-pixels. Each sub-pixel of the plurality of sub-pixels can include an OLED for a specific color, e.g., white, green, red, blue, or a combination thereof.

In another embodiment, the present disclosure provides devices. The devices include a substrate. An inorganic layer is disposed on the substrate, in which the inorganic layer defines sub-pixels of the device. The inorganic layer includes a plurality of overhang structures. The device includes a plurality of sub-pixels, each sub-pixel including an anode, an organic light-emitting diode (OLED) material disposed over and in contact with the anode, a cathode disposed over and in contact with the OLED material, and an encapsulation layer disposed over the OLED material. The encapsulation layer includes a lateral portion and a central portion, in which the lateral portion includes an arcuate surface. A resist is disposed over the encapsulation layer, in which the resist fills the cavity of the encapsulation layer.

Overall, a sub-pixel circuit for an OLED device and methods of forming a sub-pixel circuit are described herein. The methods utilize a pixel opening to confine the deposition of an OLED material, a cathode layer, a local passivation layer, and a device resist material. The pixel opening is maintained to increase the pixels per inch of the OLED device. By depositing the encapsulation layer to fill a void formed under the overhang of the plurality of overhand structures, a reduction in dark pixels, cathode contact, pixel defining layer damage, and pixel damage may be achieved. Moreover, the use of a self-mask resist that can ash a first portion of the resist that is not located within the pixel opening can reduce overhang oxidation, residue under the overhang from building up, pixel defining layer damage, cathode coverage challenges, and encapsulation layer buildup on the overhang structures. Moreover, the overhang structures can be transparent, thereby allowing for efficient device performance.

While the foregoing is directed to embodiments of the present disclosure, other and further embodiments of the disclosure may be devised without departing from the basic scope thereof, and the scope thereof is determined by the claims that follow.

What is claimed is:

1. A device, comprising:
a substrate;
an inorganic layer disposed on the substrate defining sub-pixels of the device, wherein the inorganic layer comprises a plurality of overhang structures, the over-hang structures comprising a lower structure and an upper structure disposed over the lower structure, wherein a bottom surface of the upper structure extends past a sidewall of the lower structure; and
a plurality of sub-pixels, each sub-pixel comprising:
an anode;
an organic light-emitting diode (OLED) material disposed over and in contact with the anode;
a cathode disposed over and in contact with the OLED material; and
an encapsulation layer disposed over the OLED material, the encapsulation layer comprising a singular layer having a central portion having a substantially planar upper surface extending between surfaces of lateral portions adjacent to the central portion, the central portion is disposed above the lateral portions, wherein the encapsulation layer extends under at least a portion of the upper structure, along the sidewall of the lower structure, and directly contacts the bottom surface of the upper structure.

2. The device of claim 1, further comprising a pixel defining layer (PDL) disposed on the substrate and below the inorganic layer.

3. The device of claim 1, wherein the encapsulation layer is only disposed over the plurality of sub-pixels.

4. The device of claim 1, further comprising:
a global passivation layer disposed over and in direct contact with the plurality of overhang structures such that the global passivation layer directly contacts the upper surface of the central portion of the encapsulation layer of each of the sub-pixels.

5. The device of claim 4, wherein a thickness of the global passivation layer over a first overhang structure of the plurality of overhang structures and a second overhang structure of the plurality of overhang structures is different.

6. The device of claim 4, further comprising an interme-diate layer disposed over the global passivation layer, wherein the intermediate layer comprises a monomer mate-rial.

7. The device of claim 1, wherein a metal layer is pre-patterned on the substrate, each of adjacent sub-pixels defining an exposed portion of the metal layer as the anode of a respective sub-pixel.

8. The device of claim 4, wherein a thickness of the global passivation layer over a first overhang structure of the plurality of overhang structures and a second overhang structure of the plurality of overhang structures is uniform.

9. A device, comprising:
a substrate;
an inorganic layer disposed on the substrate defining sub-pixels of the device, wherein the inorganic layer comprises a plurality of overhang structures disposed over an upper surface of the sub-pixels;
a plurality of sub-pixels, each sub-pixel comprising:
an anode;
an organic light-emitting diode (OLED) material dis-posed over and in contact with the anode;
a cathode disposed over and in contact with the OLED material;
an encapsulation layer disposed over the OLED mate-rial, the encapsulation having a central portion hav-ing a substantially planar upper surface extending between surfaces of lateral portions adjacent to the central portion, the central portion is disposed above the lateral portions; and
a resist disposed over the central portion and the lateral portions of the encapsulation layer; and
a global passivation layer disposed over and in direct contact with a first overhang structure of the plurality of overhang structures, a second overhang structure of the plurality of overhang structures, the resist of each of the sub-pixels, and the encapsulation layer of each of the sub-pixels.

10. The device of claim 9, further comprising a pixel defining layer (PDL) disposed on the substrate and below the inorganic layer.

11. The device of claim 9, wherein the encapsulation layer is only disposed over the plurality of sub-pixels.

12. The device of claim 9, wherein a thickness of the global passivation layer over the first overhang structure of the plurality of overhang structures and the second overhang structure of the plurality of overhang structures is uniform.

13. The device of claim 9, wherein a thickness of the global passivation layer over the first overhang structure of the plurality of overhang structures and the second overhang structure of the plurality of overhang structures is different.

14. The device of claim 9, further comprising an inter-mediate layer disposed over the global passivation layer, wherein the intermediate layer comprises a monomer mate-rial.

15. The device of claim 9, wherein a metal layer is pre-patterned on the substrate, and adjacent sub-pixels define exposed portions of the metal layer as the anode of a respective sub-pixel.

16. A device, comprising:
a substrate;
an inorganic layer disposed on the substrate defining sub-pixels of the device, wherein the inorganic layer comprises a plurality of overhang structures, the over-hang structures comprising a lower structure and an upper structure disposed over the lower structure, wherein a bottom surface of the upper structure extends past a sidewall of the lower structure; and
a plurality of sub-pixels, each sub-pixel comprising:
an anode;
an organic light-emitting diode (OLED) material dis-posed over and in contact with the anode;
a cathode disposed over and in contact with the OLED material; and
an encapsulation layer disposed over the OLED mate-rial, wherein:
the encapsulation layer comprises a singular layer;
the encapsulation layer comprises a lateral portion and a central portion,
the lateral portion is disposed adjacent to the central portion and comprises an arcuate surface, and
the central portion is disposed above the lateral portion and comprises a substantially planar upper surface extending from the lateral portion, wherein the encapsulation layer extends under at least a portion of the upper structure, along the sidewall of the lower structure, and directly contacts the bottom surface of the upper structure.

* * * * *